(12) United States Patent
Moradian et al.

(10) Patent No.: US 12,001,197 B2
(45) Date of Patent: Jun. 4, 2024

(54) ECO-EFFICIENCY (SUSTAINABILITY) DASHBOARD FOR SEMICONDUCTOR MANUFACTURING

(71) Applicant: Applied Materials, Inc., Santa Clara, CA (US)

(72) Inventors: Ala Moradian, San Jose, CA (US); Elizabeth Neville, Sunnyvale, CA (US); Umesh Madhav Kelkar, Cupertino, CA (US); Mark R. Denome, Sunnyvale, CA (US); Prashanth Kothnur, San Jose, CA (US); Karthik Ramanathan, Karnataka (IN); Kartik Shah, Saratoga, CA (US); Orlando Trejo, Santa Clara, CA (US); Sergey Meirovich, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/230,897

(22) Filed: Apr. 14, 2021

(65) Prior Publication Data

US 2022/0334569 A1    Oct. 20, 2022

(51) Int. Cl.
*H01L 21/67*     (2006.01)
*G05B 13/02*    (2006.01)
(Continued)

(52) U.S. Cl.
CPC ..... *G05B 19/41885* (2013.01); *G05B 13/027* (2013.01); *G05B 2219/32335* (2013.01);
(Continued)

(58) Field of Classification Search
CPC .......... G05B 19/41885; G05B 13/027; G05B 2219/32335; G05B 2219/32359;
(Continued)

(56) References Cited

U.S. PATENT DOCUMENTS 6,913,938 B2 * 7/2005 Shanmugasundram ...................... C23C 16/52
427/9
9,129,231 B2 9/2015 Kaufman et al.
(Continued)

FOREIGN PATENT DOCUMENTS

CN    105512445 A      4/2016
EP      3846092 A1 *  7/2021    ....... G05B 19/41885
(Continued)

OTHER PUBLICATIONS

International Search Report and Written Opinion for the International Application No. PCT/US2022/024460, dated Aug. 2, 2022, 10 pages.

(Continued)

*Primary Examiner* — Mohammed Shamsuzzaman
(74) *Attorney, Agent, or Firm* — Lowenstein Sandler LLP

(57) ABSTRACT

A method including receiving, by a processing device, a first selection of at least one of a first fabrication process or first manufacturing equipment to perform manufacturing operations of the first fabrication process. The method can further include inputting the first selection into a digital replica of the first manufacturing equipment wherein the digital replica outputs physical conditions of the first fabrication process. The method may further include determining environmental resource usage data indicative of a first environmental resource consumption of the first fabrication process run on the first manufacturing equipment based on the physical conditions of the first fabrication process. The processing device may further determine a modification to the first fabrication process that reduces the environmental resource consumption of the first fabrication process run on the first manufacturing equipment. The method can further include
(Continued)

performing at least one of applying the modification to the first fabrication.

14 Claims, 9 Drawing Sheets

(51) Int. Cl.
*G05B 19/418* (2006.01)
*G05B 19/41* (2006.01)

(52) U.S. Cl.
CPC .............. *G05B 2219/32359* (2013.01); *G05B 2219/45031* (2013.01); *H01L 21/67276* (2013.01)

(58) Field of Classification Search
CPC ...... G05B 2219/45031; G05B 13/0265; H01L 21/67276
See application file for complete search history.

(56) References Cited

U.S. PATENT DOCUMENTS

| | | | |
|---|---|---|---|
| 11,144,701 B2 * | 10/2021 | Egan | G06T 19/20 |
| 2002/0069349 A1 | 6/2002 | Toprac | |
| 2003/0055522 A1 * | 3/2003 | Mukuta | G05B 19/41865 700/106 |
| 2008/0054741 A1 * | 3/2008 | Oyama | F16C 32/0444 417/423.4 |
| 2010/0249968 A1 | 9/2010 | Neuber et al. | |
| 2010/0249975 A1 | 9/2010 | Rezayat | |
| 2011/0060443 A1 | 3/2011 | Schwarm | |
| 2011/0144791 A1 | 6/2011 | Loldj et al. | |
| 2012/0150330 A1 * | 6/2012 | Lee | G05B 19/41875 700/104 |
| 2012/0283863 A1 * | 11/2012 | Beum | G05B 19/41865 700/101 |
| 2013/0018809 A1 | 1/2013 | Li et al. | |
| 2013/0325200 A1 | 12/2013 | Noureldin et al. | |
| 2014/0095263 A1 | 4/2014 | McAlister et al. | |
| 2015/0347943 A1 | 12/2015 | Burke et al. | |
| 2016/0045841 A1 | 2/2016 | Kaplan et al. | |
| 2017/0308071 A1 | 10/2017 | Denome et al. | |
| 2019/0251489 A1 | 8/2019 | Berti et al. | |
| 2019/0340843 A1 | 11/2019 | McCarson et al. | |
| 2020/0043764 A1 | 2/2020 | Clark et al. | |
| 2020/0226742 A1 | 7/2020 | Sawlani et al. | |
| 2020/0310526 A1 * | 10/2020 | de Beus | G06F 1/3284 |
| 2021/0042570 A1 * | 2/2021 | Iskandar | G06F 11/3495 |
| 2021/0089935 A1 * | 3/2021 | Jepperson | G06N 5/04 |
| 2021/0264076 A1 * | 8/2021 | Yamamoto | H01L 21/67288 |
| 2021/0287354 A1 * | 9/2021 | Kumar | G06T 7/10 |
| 2022/0207223 A1 * | 6/2022 | Das | H01L 21/702 |
| 2022/0246454 A1 * | 8/2022 | Nahas | G05B 19/4184 |
| 2022/0246481 A1 * | 8/2022 | Sundar | H01L 22/26 |
| 2022/0284342 A1 * | 9/2022 | Cantwell | G06F 18/24147 |
| 2023/0014145 A1 * | 1/2023 | Shankaramurthy | B33Y 50/02 |
| 2023/0049157 A1 | 2/2023 | Sawlani et al. | |
| 2023/0195061 A1 * | 6/2023 | Gadre | G05B 13/048 700/159 |

FOREIGN PATENT DOCUMENTS

| | | | | |
|---|---|---|---|---|
| JP | 2015-222511 A | | 12/2015 | |
| JP | 7325356 B2 | * | 8/2023 | ......... G05B 19/0426 |
| WO | WO-2016058645 A1 | * | 4/2016 | ............. A63F 13/46 |
| WO | 2017184400 A1 | | 10/2017 | |
| WO | WO-2017184400 A1 | * | 10/2017 | ....... G05B 19/41885 |
| WO | 2021019551 A1 | | 2/2021 | |
| WO | 2021108680 A1 | | 6/2021 | |
| WO | WO-2021124608 A1 | * | 6/2021 | ....... G06Q 10/06312 |
| WO | WO-2021154747 A1 | * | 8/2021 | ......... G05B 13/0265 |

OTHER PUBLICATIONS

Boyd, Sarah B. "Life-Cycle Energy Demand and Global Warning Potential of Computational Logic"; Environmental Science & Technology, May 28, 2009, pp. 7303-7309; vol. 43.

Sproedt, Alexander et al. "Environmental Value Stream Map as a Communicative Model for Dscrete-Event Material Flow Simulation."; 4th World P&OM Conference/19th International Annual EurOMA Conference 2012; University of Amsterdam; Eindhoven University of Technology; University of Groningen; Erasmus University Rotterdam; VU University Amsterdam; ETH Zurich Research Collection; 11 pages.

Gontarz, Adam, et al., "Resource consumption measurement in manufacturing environments." Proceeding of the GCSM 2012, 10th Global Conference on Sustainable Manufacturing, 2012; ETH Zurich Research Collection; 8 pages.

International Search Report and Written Opinion for the International Application No. PCT/US2022/051859, dated Apr. 3, 2023, 10 pages.

* cited by examiner

ECO-EFFICIENCY (SUSTAINABILITY) DASHBOARD FOR SEMICONDUCTOR MANUFACTURING

TECHNICAL FIELD

The instant specification generally relates to environmental impact of semiconductor manufacturing equipment. More specifically, the instant specification relates to monitoring, identifying modifications, and performing optimizations of ecological efficiency (eco-efficiency) of semiconductor manufacturing processes and semiconductor manufacturing equipment performing functions associated with the manufacturing process.

BACKGROUND

The continued demand for electronic devices calls for an increasingly larger demand for semiconductor wafers. The increase in manufacturing to produce these wafers takes a substantial toll on the environment in the form of resource utilization and the creation of environmentally damaging waste. Thus, there is an increased demand for more ecologically-friendly and environmentally responsible methods of wafer manufacture and of manufacturing in general. Given that wafer processing is energy intensive, there is value in decoupling the semiconductor industry's growth from its environmental impact.

SUMMARY

The following is a simplified summary of the disclosure in order to provide a basic understanding of some aspects of the disclosure. This summary is not an extensive overview of the disclosure. It is not intended to delineate any scope of the particular implementations of the disclosure or any scope of the claims. Its sole purpose is to present some concepts of the disclosure in a simplified form as a prelude to the more detailed description that is presented later.

A method and a system for identifying modifications to a manufacturing process associated with altering (e.g., improving) eco-characteristics (e.g., reducing per-unit environmental resource consumption) of a semiconductor manufacturing process and associated operations performed by semiconductor manufacturing equipment are described. In some embodiments, the method can include receiving, by a processing device, a first selection of at least one of a first fabrication process or first manufacturing equipment to perform manufacturing operations of the first fabrication process. The method can further include inputting the first selection into a digital replica of the first manufacturing equipment, wherein the digital replica outputs physical conditions of the first fabrication process. The method may further include determining environmental resource usage data indicative of a first environmental resource consumption (e.g., a per-unit environmental resource consumption) and/or environmental impact (e.g., gaseous or particulate species entering the atmosphere) of the first fabrication process run on the first manufacturing equipment based on the physical conditions of the first fabrication process. The method may further include determining a modification to the first fabrication process that reduces the per-unit environmental resource cost of the first fabrication process run on the first manufacturing equipment. The method can further include performing at least one of applying the modification to the first fabrication process or providing the modification for display by a graphical user interface (GUI).

In some embodiments, a method for training a machine learning model to identify modifications to a selection of a fabrication process or manufacturing equipment to perform manufacturing operations of the fabrication process is performed. The method includes generating training data for the machine learning model. Generating the training data may include identifying a first training input having a first selection of a first fabrication process and identifying a first target output for the first training input. The first target output comprises a first modification to the first fabrication process that, when applied, reduces a first per-unit environmental resource consumption and/or environmental impact of the first fabrication process. The method further includes providing, by the computing device, the training data to train the machine learning model on a set of training inputs comprising the first training input and a set of target outputs comprising the first target output. The trained machine learning model may later receive a new selection of a new fabrication process as input and produce a new output based on the new input, the new output indicating a new modification to the new fabrication process that, when applied, reduces a new environmental resource consumption and/or environmental impact of the new fabrication process.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1:
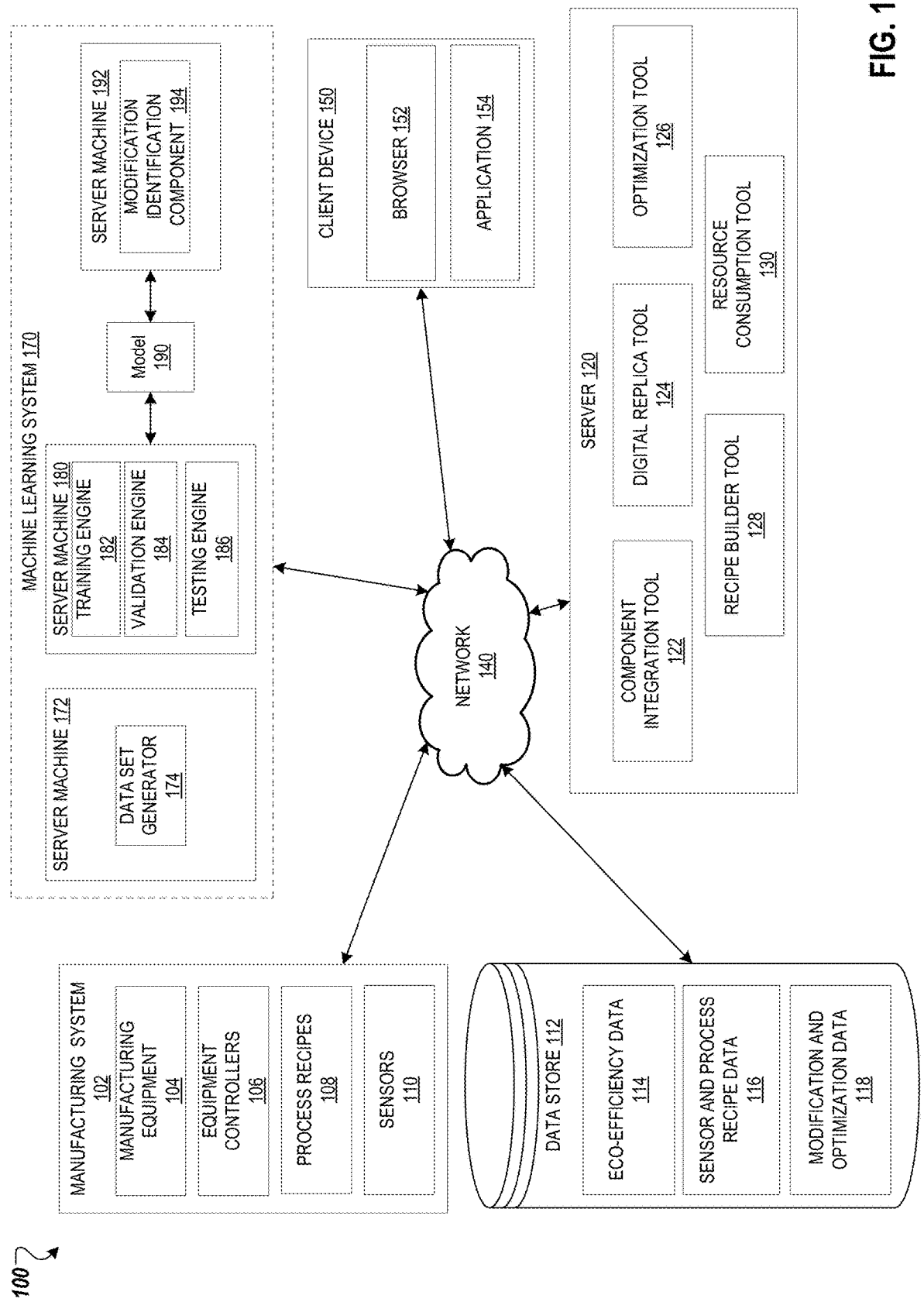
FIG. 1 is a block diagram illustrating an exemplary system architecture in which implementations of the disclosure may operate.

Ecological-efficiency (eco-efficiency) characterization is a complex technique used to determine how different levels of inputs (e.g., resources, utilization, etc.) associated with a particular manufacturing tool during use of the tool impact eco-efficiency of the manufacturing tool. Eco-efficiency characterization may be beneficial during development of a manufacturing tool to help develop manufacturing tools that maximize a per-unit (or per-time) eco-efficiency and minimize harmful environmental impact. Eco-efficiency characterization may also be beneficial after tool development, while the tool is operational, to fine tune the per-unit eco-efficiency characteristics of the tool in view of the specific parameters according to which the tool is operating.

Embodiments described herein provide a system for systematically performing eco-efficiency characterization of a manufacturing tool throughout the design, development, and manufacturing process of that tool. Embodiments further provide integration of eco-efficiency characterization and optimization of multiple processes (e.g., a cumulative consumption per semiconductor device (e.g., memory, logic, integrated circuit (IC)). Embodiments further provide using eco-efficiency characterization with a digital replica associated with a manufacturing process and/or manufacturing equipment to further determine modifications and/or optimization to reduce an environmental resource consumption and/or environmental impact (e.g., per-unit device, die, wafer, etc.).

In some embodiments, eco-efficiency is calculated on a per-unit basis. Typically, per-unit eco-efficiency is not taken into account in the manufacturing tool development process. Additionally, it can be a cumbersome and complicated process to characterize per-unit eco-efficiency to adjust settings on a manufacturing tool while that tool is in use (e.g., while a tool is used for wafer production). Furthermore, prior solutions used special eco-efficiency training of people and specialized engineers and analysts for eco-efficiency characterization analysis. Embodiments of the present disclosure provide improved methods, systems and software for eco-efficiency characterization on a per-unit basis. These methods, systems and software may be used by individuals who have not received special eco-efficiency training.

In one embodiment, eco-efficiency characterization may be performed by a software tool in all stages of a manufacturing equipment lifecycle, including during the design stages and the operational stages of wafer manufacturing equipment. Eco-efficiency may include the amount of environmental resource (e.g., electrical energy, water, gas, etc.) consumed per-unit of equipment production (e.g., per wafer, or per device manufactured). Eco-efficiency may also be characterized as the amount of environmental impact (e.g., $CO_2$ emissions, heavy metal waste, etc.) generated per-unit of equipment production.

Per-unit analysis, where a unit is any measurable quantity (e.g., a substrate (wafer), die, area ($cm^2$), time period, device, etc.) operated on by a manufacturing tool, allows for more precise characterizations of eco-efficiency. Eco-efficiency on a "per-unit" basis allows for an accurate determination of resource usage and environmental impact per-unit produced, and can be easily manipulated as a measure of value. For example, it may be determined that a particular manufacturing tool has an electrical energy per-wafer-pass eco-efficiency rating of 1.0-2.0 kWh per wafer pass (in other embodiments eco-efficiency ratings may be less than 0.5 kWh, up to 20 kWh, or even greater than 20 kWh per wafer pass), indicating that each wafer operated on by the manufacturing tool may use, for example, 1.0-2.0 kWh of electrical energy per wafer pass. In other embodiments various other amounts of electrical energy may be used. Determining eco-efficiency on a per-wafer-pass basis allows for easy comparison with other manufacturing tools that have a different yearly electrical energy consumption value due to variance in yearly wafer throughput. In one embodiment, eco-efficiency may also be determined on a per-device basis by dividing a per-wafer eco-efficiency characterization by the number of devices per wafer.

Performing eco-efficiency characterization during the early design stages of equipment manufacturing allows designers to make better, more eco-efficient design choices at minimal cost. Eco-efficiency may be manipulated and improved early on in the design stages of manufacturing equipment. Eco-efficiency characterization early on in the design process may allow for better, more eco-friendly component selection, subsystem design, system integration, process design, process materials selection, and system configuration.

In one embodiment, multiple designers may have parallel access to a database of already calculated eco-efficiency models for specific equipment or subcomponents. The designers may produce prospective designs by selecting and adding together one or more subcomponents, each of which may have their own respective eco-efficiency models. The combined eco-efficiency models of all of the subcomponents may then be combined to produce an overall eco-efficiency model for a prospective design. The prospective design and its eco-efficiency model and the eco-efficiency models of it subcomponents may be stored in a database.

At any time in the development process for a tool, an engineer may alter a configuration of that tool, which may cause a change in the eco-efficiency model for that tool. The changes to the configuration and the resulting changes to the eco-efficiency model may be stored in the database. In this way, eco-efficiency characterization (e.g., per unit eco-efficiency) can be collaborative, allowing equipment designers to benefit from each other's work. In one embodiment, designers may see updates to manufacturing equipment design in real-time, as changes associated with eco-efficiency are made. Designers may select the equipment or subcomponents with the desired eco-efficiency for the desired application. Furthermore, eco-efficiency (e.g., per-unit eco-efficiency) may be calculated for manufacturing equipment based on known eco-efficiency characterizations (e.g., per-unit eco-efficiency characterizations) for subcomponents. Such known eco-efficiency characterizations for subcomponents may be stored in a database. In another embodiment, eco-efficiency may be calculated for manufacturing equipment based combined utility and utilization data for each of the subcomponents of the manufacturing equipment.

Components and subcomponents may be compared and contrasted. If an eco-efficiency model does not already exist for a particular equipment or subcomponent, the designer may perform an eco-efficiency analysis on the equipment, and store the resulting eco-efficiency model in the database. Designers may have the option to save various versions of equipment in development, with each version having an associated eco-efficiency model. In this way, versioning is traceable and eco-efficiency may be optimized by determining the equipment design version with the desired eco-efficiency. In some embodiments, the comparison between components and subcomponents may be used to determine pattern, issues, and/or insight into chamber to chamber matching between multiple devices having multiple chamber matching. As a result of such comparison and contract between components and subcomponents or versions, an overall eco-efficiency performance, consumptions savings, such as carbon footprint can be reported.

Manufacturing equipment and subsystems are sometimes used in a variety of applications, each application having its own eco-efficiency. In such a situation, multiple eco-efficiency characterizations for the same equipment or subcomponent to be used under different conditions may be stored in a database. When a designer selects the appropriate equipment from the database, he may be presented with a variety of applications for the equipment, each with its own eco-efficiency characterization. Furthermore, a designer is able to select equipment from the database to use as a starting point for a new application that does not yet exist in the database. The designer may modify the parameters of the equipment to match the appropriate application, perform a eco-efficiency characterization, and store the result back to the database.

In another embodiment, eco-efficiency characterization may be performed on manufacturing equipment itself during operation. The manufacturing equipment may access real-time variables, such as utilization and utility use data of the equipment, and use the real-time variables in the eco-efficiency model. In this embodiment, manufacturing equipment may fine-tune settings on the equipment to maximize eco-efficiency in view of the current operating conditions of the manufacturing equipment. On-equipment eco-efficiency characterization may be beneficial to fine-tune the eco-efficiency of manufacturing equipment that was designed using theoretical, averaged, or expected variable conditions.

In some embodiments, the eco-efficiency characterization may be determined using a digital replica. A selection including one of a fabrication process or manufacturing equipment to perform manufacturing operations of the first fabrication process of the fabrication process may be inputted into the digital replica. The digital replica may include a physics based model of the fabrication process and/or the manufacturing equipment. The physics-based model may enable what-if scenarios where module/subsystem consumptions are estimated using fully-physics-based or reduced order models (e.g., lamp heating variations conceptualized before the subsystem is developed such as infrared-based lamp heating subsystem). In some embodiments, the digital replica may include other models such as statistical models to determine physical conditions (e.g., heat loss carried out by the gases leaving the exhaust and/or foreline, energy consumption, etc.) of a manufacturing process or manufacturing equipment.

In some embodiments, the eco-efficiency characterization may be integrated into multiple manufacturing processes. For example, a cumulative consumption per device or process component may be calculated across various devices and processes to coordinate a cumulative eco-efficiency. Additionally or alternatively, auxiliary or support equipment (e.g., subfabrication equipment) equipment such as equipment shared across multiple manufacturing equipment may be characterized. For example, devices and/or equipment such as pumps, abatement, heater jackets, filtration systems, etc. or other devices not used to directly process a substrate can be monitored and characterized for eco-efficiency as well.

In some embodiments, a modification to a fabrication process (e.g., a subset of the process or multiple processes) may be determined based on the environmental resource usage data or the eco-efficiency characterization. For example, environmental resource usage data may be used as input to a machine learning model. One or more output from the machine learning model may be obtained that are indicative of the modification to the fabrication process and in some embodiments a level of confidence that the modification meets a threshold condition. The modification to the fabrication process may be associated with improving an eco-efficiency of a selection of a manufacturing process (e.g., reducing a environmental resource consumption and/or environmental impact).

In some embodiments, determining one or more modification to a fabrication process may be associated with an optimization procedure for a fabrication process. The system and/or methodology may determine multiple modifications to apply to a manufacturing process to meet a predetermined eco-optimization requirement. For example, local regulation may enforce limitation on level of usage of certain resources (e.g., power, water, etc.) or incentivize lower consumption practices by different reward mechanism. The eco-efficiency system and methodology described herein, (e.g., real-time dashboard as the monitoring feature) can be readily used to prepare required reports as evidence of compliance and eco-efficiency optimization features can be used to realize savings for fabrication systems.

In some embodiments, the compliance reports may include reporting based on the generally accepted codes and/or standards such as Semiconductor Equipment and Materials International (SEMI) published in the semiconductor facility systems guideline (SEMI S23-0813) for energy, electricity, and production conservation for semiconductor manufacturing equipment. For example, SEMI S23-0813 provides the energy conversions factors (ECFs) (e.g., energy consumption per unit flow rate) of important utilities. The ECFs may estimate the energy consumption of utilities and is used to estimate energy savings at semiconductor fabrication facilities.

In some embodiments, eco-efficiency is based on resource consumption such as energy consumption, gas consumption (such as hydrogen, nitrogen, chemicals used for etching or deposition of thin films, CDA (clean dry air)), and/or water consumption (such as process cooling water (PCW), de-ionized water (DIW), and ultrapure water (UPW), for example. However in some embodiments, the eco-efficiency is based on life-cycle data of a component associated with the manufacturing equipment. For example, an environmental resource consumption and/or environmental impact associated with the eco-efficiency characterization may be associated with a replacement procedure or an upkeep procedure of a consumable part of the manufacturing equipment. The modification may be associated with the upkeep procedure of the consumable part of the manufacturing equipment.

In some embodiments, characterizing and optimizing a manufacturing process may include a recipe builder methodology. A recipe-builder methodology may include calculating a resource consumption and/or environmental impact of individual manufacturing steps dynamically as part of a recipe generation and/or modification process. A user may be capable of adding, deleting, and/or modifying various combinations, sub combinations, and/or orderings of process steps and/or manufacturing equipment to perform the processing steps. Modified recipes may be analyzed to determine eco-efficiency of the modified recipes. Performing a process may include, for example, processing a wafer, transporting a wafer, auxiliary/support equipment enabling process steps, and/or other functions associated with a fabrication process.

FIG. 1 is a block diagram illustrating an exemplary system architecture 100 in which implementations of the disclosure may operate. As shown in FIG. 1, system architecture 100 includes a manufacturing system 102, a data store 112, a server 120, a client device 150, and/or a machine learning system 170. The machine learning system 170 may be a part of the server 120. In some embodiments, one or more components of the machine learning system 170 may be fully or partially integrated into client device 150. The manufacturing system 102, the data store 112, the server 120, the client device 150, and the machine learning system 170 can each be hosted by one or more computing devices including server computers, desktop computers, laptop computers, tablet computers, notebook computers, personal digital assistants (PDAs), mobile communication devices, cell phones, hand-held computers, or similar computing devices.

The manufacturing system 102, the data store 112, the server 120, the client device 150, and the machine learning system 170 may be coupled to each other via a network (e.g., for performing methodology described herein). In some embodiments, network 160 is a private network that provides each element of system architecture 100 with access to each other and other privately available computing devices. Network 160 may include one or more wide area networks (WANs), local area networks (LANs), wires network (e.g., Ethernet network), wireless networks (e.g., an 802.11 network or a Wi-Fi network), cellular network (e.g., a Long Term Evolution (LTE) network), cloud network, cloud service, routers, hubs, switches server computers, and/or any combination thereof. Alternatively or additionally, any of the elements of the system architecture 100 can be integrated together or otherwise coupled without the use of the network 160.

The client device 150 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 150 may include a browser 152, an application 154, and/or other tools as described and performed by other systems of the system architecture 100. In some embodiments, the client device 150 may be capable of accessing the manufacturing system 102, the data store 112, the server 120, and/or the machine learning system 170 and communicating (e.g., transmitting and/or receiving) indications of eco-efficiency including one or more environmental resource consumption (e.g., an environmental resource consumption) and/or environmental impact, and/or inputs and outputs of various process tools (e.g., component integration tool 122, digital replica tool 124, optimization tool 126, recipe builder tool 128, resource consumption tool 130, and so on) at various stages of processing of the system architecture 100, as described herein.

As shown in FIG. 1 manufacturing system 102 includes machine equipment 104, equipment controllers 106, process recipes 108, and sensors 110. The machine equipment 104 may be any combination of an ion implanter, an etch reactor (e.g., a processing chamber), a photolithography devices, a deposition device (e.g., for performing chemical vapor deposition (CVD), physical vapor deposition (PVD), ion-assisted deposition (IAD), and so on), or any other combination of manufacturing devices.

Process recipes 108, also referred to as fabrication recipes or fabrication process instructions, include an ordering of machine operations with process implementation that when applied in a designated order create a fabricated sample (e.g., a substrate or wafer having predetermine properties or meeting predetermined specifications). In some embodiments, the process recipes are stored in a data store or, alternatively or additionally, stored in a manner to generate a table of data indicative of the steps or operations of the fabrication process. Each step may store a known eco-efficiency of a given process step. Alternatively or additionally, each process step may store parameters indicative of physical conditions required by a process step (e.g., target pressure, temperature, exhaust, energy throughput, and the like).

Equipment controllers 106 may include software and/or hardware components capable of carrying out steps of process recipes 108. The equipment controllers 106 may monitor a manufacturing process through sensors 110. Sensors 110 may measure process parameters to determine whether process criteria are met. Process criteria may be associated with a process parameter value window (e.g., as described in association with FIG. 5). Sensors 110 may include a variety of sensors that can be used to measure (explicitly or as a measure of) consumptions (e.g, power, current, etc). Sensors 100 could include physical sensors, Internet-of-Things (IoT) and/or virtual sensors (e.g., Sensors that are not physical sensors but based virtual measurements based on model that estimate parameter values).

Additionally or alternatively, equipment controllers 106 may monitor the eco-efficiency by measuring resource consumption of various process steps (e.g., exhaust, energy consumption, process ingredient consumption etc.). In some embodiments, the equipment controllers 106 determine the eco-efficiency of associated machine equipment 104. Equipment controllers 106 may also adjust settings associated with the manufacturing equipment 104 based on the determined eco-efficiency models (e.g., including determined modifications to process recipes 108) so as to optimize the eco-efficiency of equipment 104 in light of the current manufacturing conditions.

In one embodiment, equipment controllers 106 may include a main memory (e.g., read-only memory (ROM), flash memory, dynamic random access memory (DRAM), static random access memory (SRAM), etc.), and/or secondary memory (e.g., a data store device such as a disk drive (e.g., data store 112 or cloud data). The main memory and/or secondary memory may store instructions for performing various types of manufacturing processes (e.g., process recipes 108).

In one embodiment, equipment controllers 106 may determine an actual eco-efficiency characterization associated with the manufacturing equipment 104 based on first utility use data associated with the manufacturing equipment 104 and first utilization data associated with the manufacturing equipment 104. The first utility use data and first utilization data may be determined by the equipment controllers 106, for example. In another embodiment, the first utility use data and first utilization data are received from an external source (e.g., server 120, cloud service and/or cloud data store). Equipment controllers 106 may compare the actual eco-efficiency characterization to a first eco-efficiency characterization (e.g., a first estimated eco-efficiency characterization) associated with the manufacturing equipment 104. The eco-efficiency characterizations may be different when different use and utilization data values were used to compute the first eco-efficiency characterization than the actual values associated with the operating manufacturing equipment 104.

In one embodiment, equipment controllers 106 may determine that the first eco-efficiency characterization is more eco-efficient than the actual eco-efficiency characterization, indicating that it may be possible to adjust settings on the manufacturing equipment 104 to better optimize the manufacturing equipment 104 for eco-efficiency. In some embodiments, manufacturing equipment 104 may control and adjust subcomponent settings to better optimize eco-efficiency.

Equipment controllers 106 may also determine based on the actual use data, actual utilization data, and an eco-efficiency characterization that the actual use data or the actual utilization data is not the same as use data and utilization data associated with the first eco-efficiency characterization. This may be the case when nominal or estimated data values are used to determine the first eco-efficiency characterization and different, actual recorded data values are used while the manufacturing equipment 104 is in operation. In such a scenario, an adjustment to one or more settings associated with the manufacturing equipment 104 may be beneficial to optimize the eco-efficiency of the manufacturing equipment.

Data store 112 may be a memory (e.g., a random access memory), a drive (e.g., a hard drive, a flash drive), a database system, or another type of component or device capable of storing data such as a store provided by a cloud server and/or processor. Data store 112 may store one or more historical sensor data. Data store 112 may store one or more eco-efficiency data 114 (e.g., including historical and/or current eco-efficiency data), sensor and process recipe data 116 (e.g., including historical and/or current sensor and process recipe data 116), and modification and optimization data (e.g., including historical and/or current modification and optimization data 118). The sensor and process recipe data 116 may include various process steps, process parameter windows, alternative process steps, process queuing instruction, and so on for performing multiple processes on overlapping manufacturing equipment. The sensor and process recipe data 116 may be linked or otherwise associated with the eco-efficiency data 114 to track eco-efficiency across various process steps, recipes, etc. The modification and optimization data 118 may include historical modifications made to prior process recipes (including individual process steps, or coordination of multiple process recipes) and associated eco-efficiency changes resulting from the modifications.

The eco-efficiency data 114 may include various consumption resources used in an eco-efficiency characterization. In one embodiment, eco-efficiency data 114 incorporates one or more of water usage, emissions, electrical energy usage, and any combination thereof. In other embodiments, eco-efficiency data 114 may include resource consumption for other categories, such as gas usage, heavy metals usage, and eutrophication potential.

Server 120 may include a component integration tool 122, a digital replica tool 124, an optimization tool 126, a recipe builder tool 128, and/or a resource consumption tool 130. The component integration tool 122 may determine a cumulative consumption per device (e.g., per individual manufacturing equipment). The various tools of server 120 may communicate data between each other to carry out each respective function, as described herein.

The component integration tool 122 may receive manufacturing data (e.g., recipes, selections of recipes, manufacturing equipment, inter-recipe and intra-recipe processes, and so on) and perform an eco-efficiency analysis across varying divisions of the data. In some embodiments, the component integration tool 122 may determine an eco-efficiency characterization across multiple process steps from an individual process recipe. For example, the component integration tool 122 may determine an eco-efficiency characterization across all steps of a recipe from start to finish. In another example, a selection of the processes may be used to determine an eco-efficiency of a subset of the fabrication process steps.

In another embodiment, the component integration tool 122 may perform an eco-efficiency characterization of inter recipe processes. For example, an eco-efficiency characterization may be associated with a manufacturing device (e.g. of manufacturing system 102) performing multiple different process steps from multiple different manufacturing processes (e.g. process recipes 108). In another example, the ordering of various process steps (e.g., intra-recipe or inter-recipe) may affect an overall eco-efficiency. The component integration tool 122 may perform an overall eco-efficiency characterization across a system of manufacturing devices and/or sequence of processes. For example, the component integration tool 122 may perform an eco-efficiency comparison between subcomponents performing similar functions (e.g., multiple processing chambers).

In an illustrative example, each process step may be done by a processing chamber such as epitaxial deposition or etch. Each of these is done using a process recipe. There may be many different process recipes for performing a process such as epitaxial deposition. For example, a process recipe may include multiple steps such as: 1) purge the chamber; 2) pump; 3) flow in gases; 4) heat the chamber, and so on. These steps may be associated with one or more process recipes.

In another embodiment, the component integration tool 122 may perform an eco-efficiency characterization that includes eco-efficiency of auxiliary equipment. Auxiliary equipment may include equipment not directly used for manufacturing but that assists in carrying out various process recipes. For example, auxiliary equipment may include substrate transport systems designed to move wafers between various fabrication devices. In another example, auxiliary equipment may include heat sinks, shared exhaust ports, power delivery system, etc. The component integration tool 122 may account for auxiliary device resource consumption and combine auxiliary device resource consumption with fabrication resource consumption to determine a resource consumption for a process recipe (e.g., subset or whole recipe) or combination of recipes (e.g., subsets or whole recipes).

In another embodiment, the component integration tool 122 may perform an eco-efficiency characterization that accounts for a sequence of processes or recipes. For example, performing process step A followed by process step B may result in a first resource consumption while performing process step B followed by process step A may result in a second resource consumption different than the first resource consumption. The component integration tool 122 integrates an eco-efficiency over multiple machine equipment and/or process steps and accounts for the sequence of process steps for a process recipe (e.g., subset or whole recipe) or combination of recipes (e.g., subset or whole recipes).

In some embodiments, there is different manufacturing equipment for each of the process steps. For example a film on a wafer may have multiple layers. A first machine may perform a first operation (e.g., deposition), a second machine may perform a second operation (e.g., etching), a third machine may perform a third operation (e.g., deposition), and so on. The component integration tool 122 may instruct a resource consumption tracker to track multiple processing steps across multiple machines to generate a data stash report. As mentioned previously, a consumption report can be drawn for a selection of a processing recipe, including the life of a wafer from start to finish.

The digital replica tool 124 receives manufacturing data from manufacturing system 102 and/or client device 150 and generates a digital replica associated with the manufacturing data. The manufacturing data my include a selection of machine equipment 104 and process steps to a process recipe 108. The digital replica tool 124 generates a digital twin of the physical system architecture of the manufacturing system or a virtual inputted system (e.g., generated by a user on the client device 150).

The digital replica generated by the digital replica tool 124 may include one of a physics model, a statistical model, and/or a hybrid model. A physics model may include physics based constraints and control algorithms designed to estimate physical conditions (e.g., exhaust temperatures, power delivery requires, and/or other conditions indicative of a physics environment associated with environmental resource consumption) of the inputted manufacturing data. For example, a user may create a process recipe on client device 150. The process recipe may include parameters for a process or recipe and instructions to use machine equipment in a certain way. The digital replica tool 124 would take this manufacturing data and determine physical constraints of the system (e.g., operating temperature, pressure, exhaust parameters, etc.). For example, the physics model may identify physical conditions of a system based on the hardware configurations of chamber (e.g., using equipment material of type A versus equipment material of type B) and/or recipe parameters. In another example, physical conditions may be determined from relevant machine equipment parts that affect heat loss to water, air, and/or heating ventilation, and air conditioning (HVAC) equipment. The digital replica tool 124 may work with other tools (e.g., component integration tool 122 and/or resource consumption tool 130 to predict an eco-efficiency characterization of the received manufacturing data. It should be noted that the digital replica tool 124 may predict an eco-efficiency of a manufacturing process and selection of manufacturing equipment without receiving empirical data from performing the process recipe by the manufacturing equipment 104. Accordingly, digital replicas of manufacturing equipment may be used to predict the eco-efficiency of equipment designs and/or process recipes without actually building particular equipment designs or running particular process recipes.

In some embodiments, the physical models used by the digital replica tool 124 may include fluid flow modeling, gas flow and/or consumption modeling, chemical based modeling, heat transfer modeling, electrical energy consumption modeling, plasma modeling, and so on.

In some embodiments, the digital replica tool 124 may employ statistical modeling to predict eco-efficiency of manufacturing data. A statistical model may be used to process manufacturing data based on previously processed historical eco-efficiency data (e.g., eco-efficiency data 114) using statistical operations to validate, predict, and/or transform the manufacturing data. In some embodiments, the statistical model is generated using statistical process control (SPC) analysis to determine control limits for data and identify data as being more or less dependable based on those control limits. In some embodiments, the statistical model is associated with univariate and/or multivariate data analysis. For example, various parameters can be analyzed using the statistical model to determine patterns and correlations through statistical processes (e.g., range, minimum, maximum, quartiles, variance, standard deviation, and so on). In another example, relationships between multiple variables can be ascertained using regression analysis, path analysis, factor analysis, multivariate statistical process control (MCSPC) and/or multivariate analysis of variance (MANOVA).

The optimization tool 126 may receive selection of process recipes 108 and machine equipment 104 and identify modifications to the selections to improve eco-efficiency (e.g., reduce resource consumption, resource cost consumption, and/or environmental impact (e.g., gaseous or particulate species entering the atmosphere)). The optimization tool 126 may incorporate use of a machine learning model (e.g., model 190 of machine learning system 170). The machine learning model may receive as input a selection of a process recipe and/or machine equipment and determine one or more modification to the selection that improves overall eco-efficiency of the selection when performed by the manufacturing system 102. In some embodiments, the machine learning model may use the digital replica tool for generating synthetic manufacturing data for training. Alternatively or additionally, the machine learning model may use historical data (e.g., eco-efficiency data 114, sensor and process recipe data 116, and/or modification and optimization data 118) to train the machine learning model.

The modifications identified by the optimization tool 126 may include altering a process step, changing the order of a process, altering parameters performed by a piece of machine equipment, altering an interaction of a first process recipe with a second process recipe (e.g., order, simultaneous operations, delay times, etc.), and so on. In some embodiments, the optimization tool 126 may send instruction to manufacturing system 102 to perform the optimization directly. However, in other embodiments, the optimization tool may display the modifications on a graphical user interface (GUI) for an operator to act upon. For example, the digital replica tool 124 may send one or more modification to the client device 150 for display in the browser 152 and/or application 154.

In some embodiments, the optimization tool 126 may adjust hyper parameters of a digital twin model generated by the digital replica tool 124. As will be discussed in later embodiments, the optimization tool 126 may incorporate reinforcement learning and/or deep learning by running simulated modifications on the digital replica and evaluating eco-efficiency outcomes output from the digital replica.

In some embodiments, the optimization tool 126 may perform an eco-efficiency characterization and optimization that prioritizes one or more types of environmental resources. For example, as described previously eco-efficiency characterization can be based on various resource consumptions such as water usage, gas usage, energy usage, and so on. The optimization tool 126 may perform an optimization that prioritizes a first resource consumption (e.g., water usage) over a second resource consumption (e.g., gas usage). In some embodiments, the optimization tool 126 may perform an optimization that uses a weighted priority system. For example, when optimizing eco-efficiency and/or identifying eco-efficiency modification to a fabrication process one or more resource consumptions may be assigned a weight indicative of an optimization priority for the associated per-unit resource consumption.

The recipe builder tool 128 may receive a selection of manufacturing processes and/or machine equipment and determine and predict eco-efficiency dynamically step-by-step after each addition, deletion, and/or modification to a virtual manufacturing process and/or equipment selection. Recipe builder tool 128 can use other tools (e.g., component integration tool 122, the digital replica tool 124, optimization tool 126, and resource consumption tool 130) to dynamically update a determined eco-efficiency when a manufacturing recipe is updated. For example, a user may create a manufacturing recipe. The recipe builder tool 128 may output a current eco-efficiency of a current iteration of a process recipe. The recipe builder tool 128 may receive a modification to the current iteration that updated the process recipe. The recipe builder tool 128 may output an updated eco-efficiency characterization.

The resource consumption tool 130 may track various resource consumptions. For example, as mentioned previously eco-characterization may be based on more widespread resources such as energy consumption, gas emissions, water usage, etc. However, the resource consumption tool 130 can track resource consumption more specifically. In some embodiments, a selection of process recipes and/or manufacturing equipment is received by resource consumption tool 130. The resource consumption tool 130 can determine life-cycle data of a component associated with the selection of manufacturing equipment and/or process recipes. For example, manufacturing equipment wears down over use and in some instances requires corrective action such as replacement and/or repairing a component. This corrective action also is associated with an environmental consumption (e.g., resource consumption to perform the corrective action). The resource consumption tool 130 can individually track component life-time data and provide a per-unit environmental resource consumption and/or environmental impact based on anticipated future corrective action to be performed.

In some embodiments, the digital twin may be used to estimate life time of some consumables associated with a fabrication process step. Life time data may be used to estimate a life time duration and predict upcoming remedial steps to be taken in response to the predicted lifetime. For example, life time data may be used to maintain an optimized eco-efficiency performance by proactively informing supply chain for replacement part ordering.

In some embodiments, environmental resource usage data determined by other tools of the server may include environmental resource consumption and/or environmental impact associated with one of a replacement procedure or an upkeep procedure of a consumable part of the first manufacturing equipment. In some embodiments, the optimization tool 126 may determine modifications to a manufacturing process that may include performing a corrected action associated with a component of the machine equipment (e.g., machine equipment 104).

In some embodiments, machine learning system 170 further includes server machine 172, server machine 180, and/or server machine 192. Server machine 172 includes a data set generator 174 that is capable of generating data sets (e.g., a set of data inputs and a set of target outputs) to train, validate, and/or test a machine learning model 190. Some operations of data set generator 174 are described in detail below with respect to FIGS. 7A-C.

Server machine 180 includes a training engine 182, a validation engine 184, and/or a testing engine 186. An engine (e.g., training engine 182, a validation engine 184, and/or a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training a machine learning model 190 using one or more sets of features associated with the training set from data set generator 174. The training engine 182 may generate one or multiple trained machine learning models 190, where each trained machine learning model 190 may be trained based on a distinct set of features of the training set and/or a distinct set of labels of the training set. For example, a first trained machine learning model may have been trained using resource consumption data output by the digital replica tool 124, a second trained machine learning model may have been trained using historical eco-efficiency data (e.g., eco-efficiency data 114), and so on.

The validation engine 184 may be capable of validating a trained machine learning model 190 using the validation set from data set generator 174. The testing engine 186 may be capable of testing a trained machine learning model 190 using a testing set from data set generator 174.

The machine learning model(s) 190 may refer to the one or more trained machine learning models that are created by the training engine 182 using a training set that includes data inputs and, in some embodiments, corresponding target outputs (e.g., correct answers for respective training inputs). Patterns in the data sets can be found that cluster the data input and/or map the data input to the target output (the correct answer), and the machine learning model 190 is provided mappings and/or learns mappings that capture these patterns. The machine learning model(s) 190 may include artificial neural networks, deep neural networks, convolutional neural networks, recurrent neural networks (e.g., long short term memory (LSTM) networks, convLSTM networks, etc.), and/or other types of neural networks. The machine learning models 190 may additionally or alternatively include other types of machine learning models, such as those that use one or more of linear regression, Gaussian regression, random forests, support vector machines, and so on.

Modification identification component 194 may provide current data to the trained machine learning model 190 and may run the trained machine learning model 190 on the input to obtain one or more outputs. The modification identification component 194 may be capable of making determinations and/or performing operations from the output of the trained machine learning model 190. ML model outputs may include confidence data that indicates a level of confidence that the ML model outputs (e.g., modification and optimization parameters) correspond to modifications that when applied improve an overall eco-efficiency of a selection of a manufacturing process and/or manufacturing equipment. The modification identification component 194 may perform process recipe modifications based on the ML model outputs in some embodiments. The modification identification component 194 may provide the ML model outputs to one or more tools of the server 120.

The confidence data may include or indicate a level of confidence that the ML model output is correct (e.g., ML model output corresponds to a known label associated with a training data item). In one example, the level of confidence is a real number between 0 and 1 inclusive, where 0 indicates no confidence that the ML model output is correct and 1 indicates absolute confidence that the ML model output is correct. Responsive to the confidence data indicating a level of confidence below a threshold level for a predetermined number of instances (e.g., percentage of instances, frequency of instances, total number of instances, etc.) the server 120 may cause the trained machine learning model 190 to be re-trained.

For purpose of illustration, rather than limitation, aspects of the disclosure describe the training of a machine learning model using process recipe data and inputting a current selection of a manufacturing process and/or manufacturing equipment into the trained machine learning model to determine ML model output (process modification and optimization parameters such as a target eco-efficiency of a specific resource consumption). In other implementations, a heuristic model or rule-based model is used to determine an output (e.g., without using a trained machine learning model).

In some embodiments, the functions of manufacturing system 102, client device 150, machine learning system 170, data store 112, and/or server 120 may be provided by a fewer number of machines. For example, in some embodiments server machines 172 and 180 may be integrated into a single machine, while in some other embodiments, server machine 172, server machine 180, and server machine 192 may be integrated into a single machine. In some embodiments, server 120, manufacturing system 102, and client device 150 may be integrated into a single machine.

In general, functions described in one embodiment as being performed by manufacturing system 102, client device 150, and/or machine learning system 170 can also be performed on server 120 in other embodiments, if appropriate. In addition, the functionality attributed to a particular component can be performed by different or multiple components operating together. For example, in some embodiments, the server 120 may receive manufacturing data and perform machine learning operations. In another example, client device 150 may perform the manufacturing data processing based on output from the trained machine learning model.

In addition, the functions of a particular component can be performed by different or multiple components operating together. One or more of the server 120, manufacturing system 102, or machine learning system 170 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Figure 2:
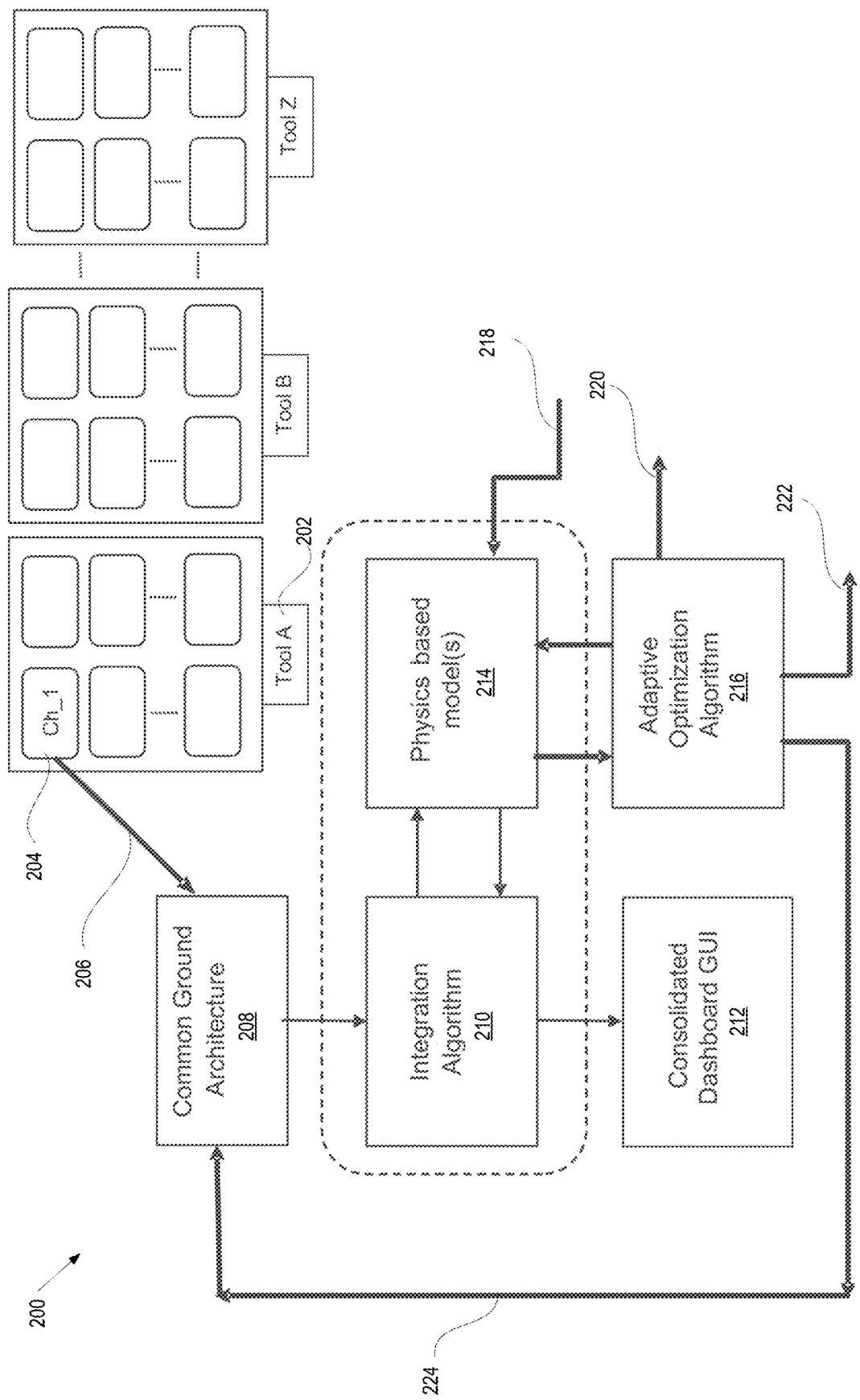
FIG. 2 is a block diagram illustrates an eco-efficiency sustainability system architecture in which implementations of the disclosure may operate.

FIG. 2 is a block diagram that illustrates an eco-efficiency sustainability system architecture 200 in which implementations of the disclosure may operate. The system architecture 200 includes a selection of processing tools 202 with one or more subcomponents 204 (e.g., processing chambers). As described previously processing tools 202 include various manufacturing tools used for processing substrates. At line 206, sensors measure and transmit manufacturing data (e.g., energy consumption sensor data, gases and water consumption data, etc.) to a common ground architecture 208. The common ground architecture 208 may include one or more control algorithm configured to carry out fabrication process steps and manage process parameters (e.g., critical process parameter, machine equipment diagnostic parameters, or parameters otherwise indicative of a manufacturing process)

The common ground architecture 208 may transmit the sensor data (e.g., from wired sensor and/or wireless sensors such as internet of things (IOT) sensor) to a data management algorithm (e.g., integration algorithm 210). The integration algorithm 210 may parse the manufacturing data received from the processing tools 202 to select a portion of the data to perform an eco-efficiency characterization. The integration algorithm 210 pulls data to perform a cumulative eco-efficiency characterization over a selection of manufacturing process steps and/or manufacturing equipment. The selected data may be used in association with a physics based model 214 to determine physical conditions of the processing tool 202 (e.g., of each subcomponent 204). The data may be combined with scheduling information from an onboard sequencer and/or planner or from an operator (e.g., at line 218). The scheduling information may include data indicative of upcoming recipes, tool idle states, maintenance, and so on.

The selection of manufacturing data combined with the scheduling data is input into the physics-based model 214. In some embodiments the physics-based model is a mechanistic model. The mechanistic model examines the workings of individual data points of the manufacturing data and scheduling information and the manner to which the individual data points are coupled to determine a physical/mechanistic representation of the data coupling. In some embodiments, the mechanistic model may include processing the data to determine a prediction of resource consumption. For example, the mechanistic model may process the manufacturing data to determine a resource consumption (e.g., water, energy, gas, etc.) prediction and/or environmental impact (e.g., gaseous or particulate species entering the atmosphere). The mechanistic model may be generated using historical manufacturing data and later used on current data to determine a prediction.

In some embodiments, the physics based model(s) 214 may incorporate various physics relationships such as thermodynamics, fluid dynamics, energy conservation, gas laws, mechanical system, energy conservation, transportation, and delivery, and so on. For example, a processing tool may include a cooling water flow to a part of a manufacturing equipment device to perform a cooling process. A physics model may incorporate fluid mechanics with heat transfer to determine a model for transforming raw manufacturing data to system process data that can be characterized for its eco-efficiency. In some embodiments, the physics models may be used to determine whether a threshold resource consumption condition is being met. Along the same example, a physics model can be used to determine a flow rate of the fluid and in turn a heat transfer rate within a subcomponent. If this heat transfer rate is below a threshold rate additional energy may be lost to exhaust. The physics model can thus determine that the fluid flow rate is operating below a desired flow rate level to maintain a desired level of eco-efficiency.

In some embodiments, the physics based model(s) 214 incorporates auxiliary or peripheral equipment operational resource consumption. For example, the energy consumption of powering a processing device to provide control algorithms (e.g., using the common ground architecture 208) to the processing tools 202. The auxiliary equipment may not be disposed proximate the manufacturing equipment nor be directly associated with a single manufacturing process but can be apportioned as contributions to various manufacturing processes steps (or individual manufacturing processes) using the physics based model(s) 214.

In some embodiments, in addition to or alternatively to use of a physics model, a statistical model is used on the manufacturing data. A statistical model may be used to process the data based on statistical operations to validate, predict, and/or transform the manufacturing data. In some embodiments, the statistical model is generated using statistical process control (SPC) analysis to determine control limits for data and identify data as being more or less dependable based on those control limits. In some embodiments, the statistical model is associated with univariate and/or multivariate data analysis. For example, various parameters can be analyzed using the statistical model to determine patterns and correlations through statistical processes (e.g., range, minimum, maximum, quartiles, variance, standard deviation, and so on). In another example, relationships between multiple variables can be ascertained using regression analysis, path analysis, factor analysis, multivariate statistical process control (MCSPC) and/or multivariate analysis of variance (MANOVA).

In some embodiments, the system architecture 200 includes and adaptive optimization algorithm 216. The adaptive optimization algorithm 216 works with the physics based model(s) 214 to determine modification to selections of manufacturing processes and/or manufacturing equipment performing associated processes. In some embodiments, the adaptive optimization algorithm outputs automatic optimization commands to control software (e.g., at line 224). In other embodiments, the adaptive optimization algorithm may output suggestions to an operator to optimize performance (e.g., at line 220). In some embodiments, the adaptive optimization algorithm outputs automatic optimization commands directed to hardware components (e.g. at line 222).

In some embodiments, the adaptive optimization algorithm 216 uses a machine learning model to determine modifications to manufacturing processes and/or manufacturing equipment. The machine learning model may be a trained machine learning model (e.g., trained and executed using methods 700A-C). As will be discussed in further embodiments, the machine learning model may operate with the physics-based models to identify modifications to manufacturing processes and/or equipment received as input.

The system architecture 200 may include a consolidated dashboard GUI 212. The consolidated dashboard GUI may be designed to display relevant manufacturing data (e.g., sensor data, machine equipment diagnostics, machine equipment status, manufacturing process status, etc.). In some embodiments, the consolidated dashboard GUI includes methods to receive input from a user. For example, a user may input manufacturing data (e.g., using the recipe builder tool 128) to generate a recipe. This additional manufacturing data may be used as input into one or more of the physics based model(s) and adaptive optimization algorithm 216.

Figure 3:
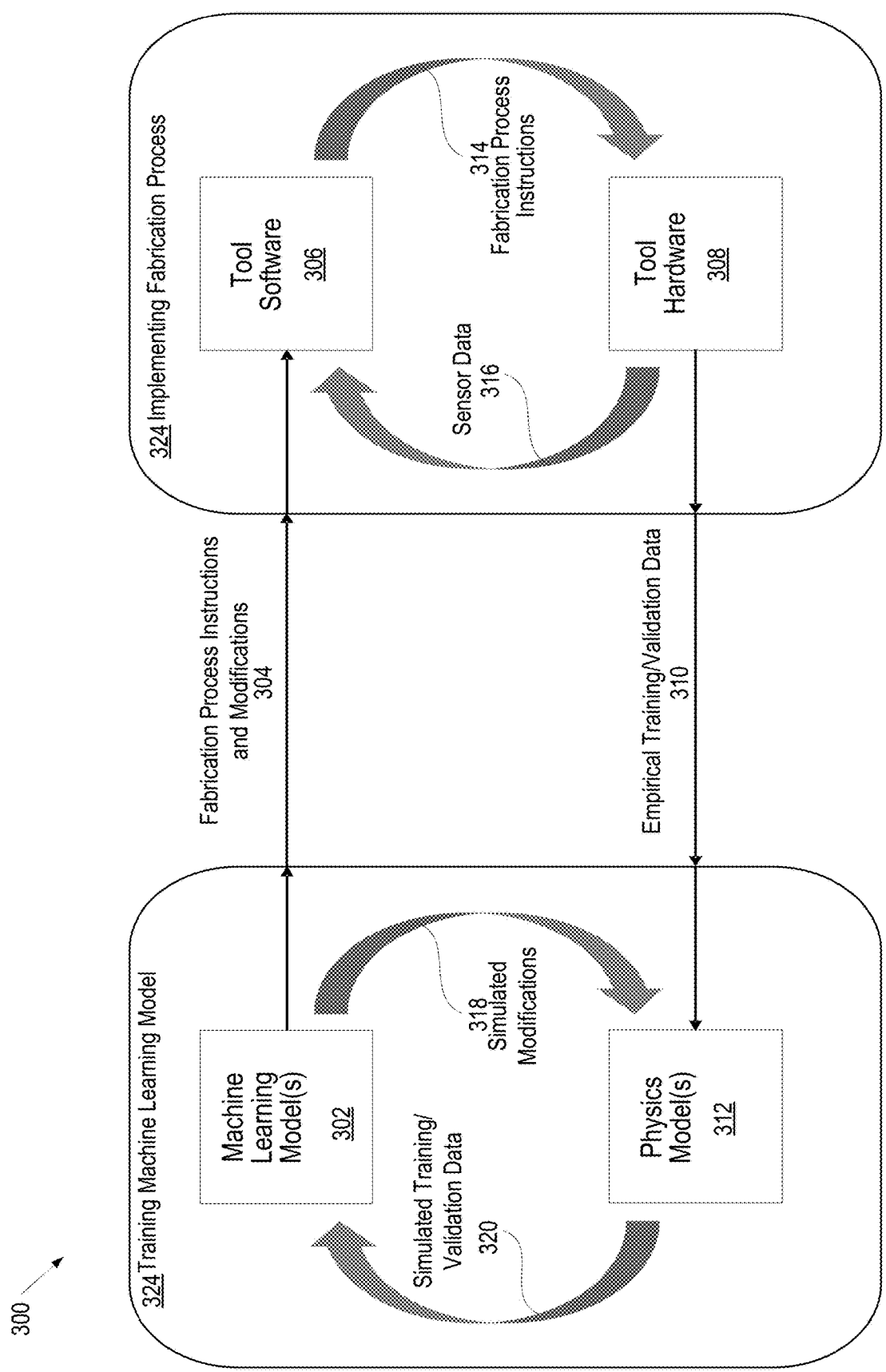
FIG. 3 depicts a flow diagram of an exemplary methodology for monitoring, sustaining, and/or optimizing a manufacturing process.

FIG. 3 depicts a flow diagram of an exemplary methodology 300 for monitoring, sustaining, and/or optimizing a manufacturing process. The exemplary methodology can be split into two parts: first, training a machine learning model 324 and second, implementing a fabrication process 324. The exemplary methodology 300 includes a machine learning model 302, tool software 306, tool hardware 308, and a physics model 312 in one embodiment.

In some embodiments, the machine learning model is to receive a selection of a manufacturing process and/or manufacturing equipment and output one or more modification to the manufacturing process and/or manufacturing equipment to improve eco-efficiency (e.g., reduce a resource consumption). In some embodiments, the physics model 312 is used to generate simulated training/validation data 320 (e.g., using method 700A). Responsive to the received simulated training/validation data 320, the machine learning model 302 generates simulated modifications 318 that may be returned to the physics model 312 and validated. The machine learning model 302 is trained over a variety of simulated and/or real training/validation data 320. Once trained, the machine learning model 302 may receive a selection of an empirical fabrication system and/or a process recipe to be performed by the system. The machine learning model 302 outputs fabrication process instructions and/or modifications 304 to equipment controllers (e.g., equipment controllers 106) implementing tool software 306. These modifications may improve eco-efficiency. The tool software 306 provides fabrication process instructions 314 to the tool hardware 308. The tool hardware 308 implements the fabrication process. The tool hardware includes sensors that report sensor data back to equipment controllers implementing the tool software 306.

In some embodiments, the equipment controllers identify one or more physical condition of the tool hardware as violating a threshold condition. (e.g., to high temperature, over pressure, gas leakage, power shortage, etc.). The equipment controller may modify the fabrication process instructions to remedy the violating threshold condition (e.g., based on an output from machine learning model 302).

The manufacturing system including tool hardware 308 reports empirical training/validation 310 back to the physics model 312. The physics model may then be updated and may generate and update simulated training/validation data 320 that may be used to further training of the machine learning model.

In some embodiments, the physics model(s) 312 generates simulated training/validation data, however, in other embodiments the physics model(s) outputs modifications to a fabrication process. In such an embodiment, the machine learning model may be used as an optimization model that tunes hyper parameters (e.g., manufacturing data parameters) to identify modifications to further optimize the fabrication process. For example, a fabrication process may be used as input to physics model 312. The machine learning model may then process outputs of physics model 312 to identify potential changes (i.e., hyper parameters) to the fabrication process. The identified changes may be run on the physics model to determine corresponding updated eco-efficiencies. This may be repeated in an iterative process to fine-tune an equipment design and/or a recipe design. In an example the optimization model may be generated and/or implemented using an instance of the Broyden-Fletcher-Goldfarb-Shanno (BFGS) algorithm, a conjugate gradient (CG) algorithm, an instance of the Nelder-Mead algorithm, and/or a model predictive control (MPC) algorithm.

Figure 4:
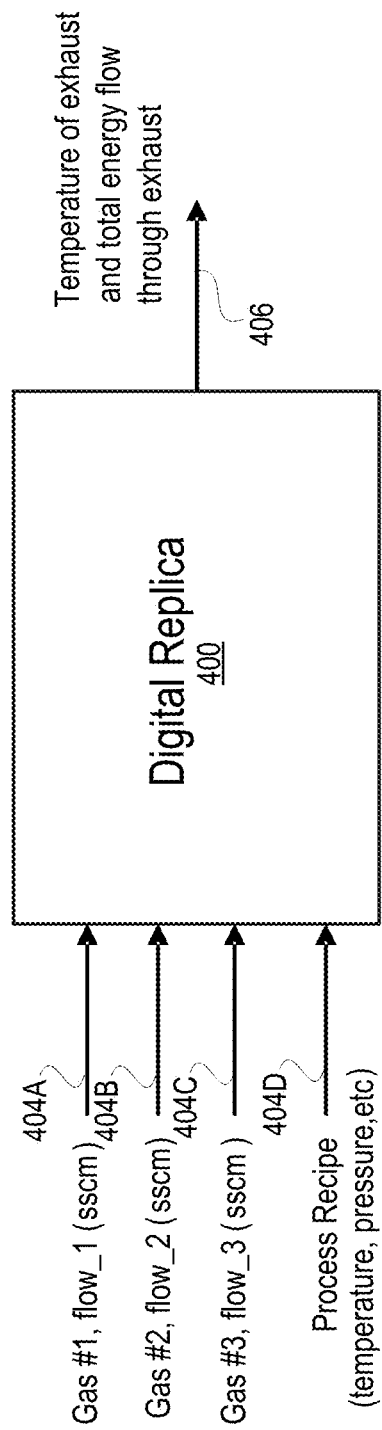
FIG. 4 depicts an exemplary digital replica, in accordance with some implementations of the present disclosure.

FIG. 4 depicts an exemplary digital replica 400, in accordance with some implementations of the present disclosure. A digital replica 400 may include a digital twin of a selection of a fabrication system, and may include, for example, a digital reproduction of the fabrication system that includes the same chambers, valves, gas delivery lines, materials, chamber components, and so on. A digital replica 400 can receive as input manufacturing equipment processing data (e.g., sensor data) 404A-C and process recipes 404D and output physical conditions 406 of the fabrication system. In some embodiments, the digital replica 400 includes a physics based model that can incorporate various physics relationships such as thermodynamics, fluid dynamics, energy conservation, gas laws, mechanical system, energy conservation, transportation, and deliver, and so on.

For example, as seen in FIG. 4, the digital replica receives as input a first gas flow of a first gas 404A, a second gas flow of a second gas 404B, and a third gas flow of a third gas 404C, and a first process recipe 404D. The digital replica uses a physics based model to estimate the amount of energy leaving the chamber by the gas flow. For example, the model determines a temperature of exhaust and total energy flow through the exhaust. In another example the same digital replica 400 may output eco-efficiency optimization modifications such as different hardware configuration of the chamber (e.g., using a first line type A versus using a second line type B). The digital replica may identify relevant part of the system that affect heat loss to water, air, and HVAC and make identify suggested optimization to improve energy conservation.

Figure 5:
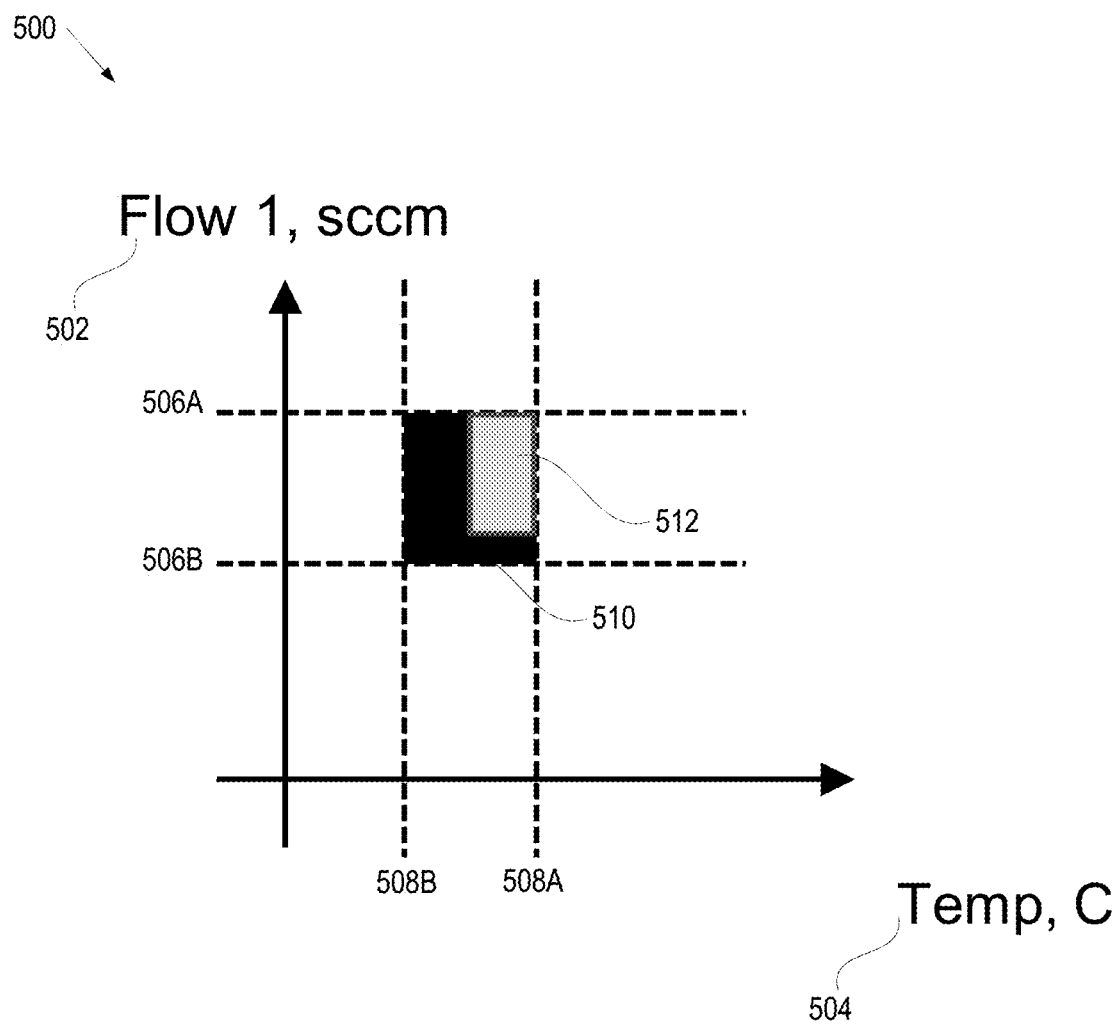
FIG. 5 is an exemplary illustration of a process parameter value window, in accordance with some implementation of the present disclosure.

FIG. 5 is an exemplary illustration of an operational parameter limitation 500 for a fabrication process step, in accordance with some implementation of the present disclosure. Various fabrication process steps may include operational parameter limitations 500 that indicate a process parameter window 510 or set of values (e.g., a combination of values) to a set of corresponding parameters that when satisfied attain a result that meets threshold condition (e.g., a minimum quality condition). For example, a process parameter window 510 may include a first parameter 502 (e.g., a first flow rate of a first gas) and a second parameter 504 (e.g., temperature of the gas). To perform a fabrication process and meet a threshold condition (e.g., minimum quality standard, statistical process control (SPC) limit, specification limitations, etc.), a process parameter value window 510 is determined that identifies parameter value combinations that result in a product likely to meet the threshold condition. As shown in FIG. 5, the process parameter window 510 includes a lower limit 506A and a higher limit 506A to the first parameter 502 as well as a lower limit 508B and an upper limit 508A to the second parameter.

Optimizations identified by the manufacturing process system (e.g., using adaptive optimization algorithm 216 and/or physics based models 214) may include determining an eco-optimized process parameter window 512 within the process parameter window 510 that causes a manufacturing operation to consume a reduced amount of resources as compared to process parameter values outside of the eco-optimized process parameter window 512.

It should be noted that FIG. 5 depicts a simplified process parameter window 510 and eco-optimized process parameter window 512 dependent on only two parameters 502, 504. The process parameter window 510 and eco-optimized process parameter window 512 both form simple rectangles. A process parameter window may include more than two parameters and can include more diverse parameter dependencies. For example, a non-linear physics based relationship between parameters may cause non-linear process parameter windows and eco-optimized process parameter windows.

Figure 6:
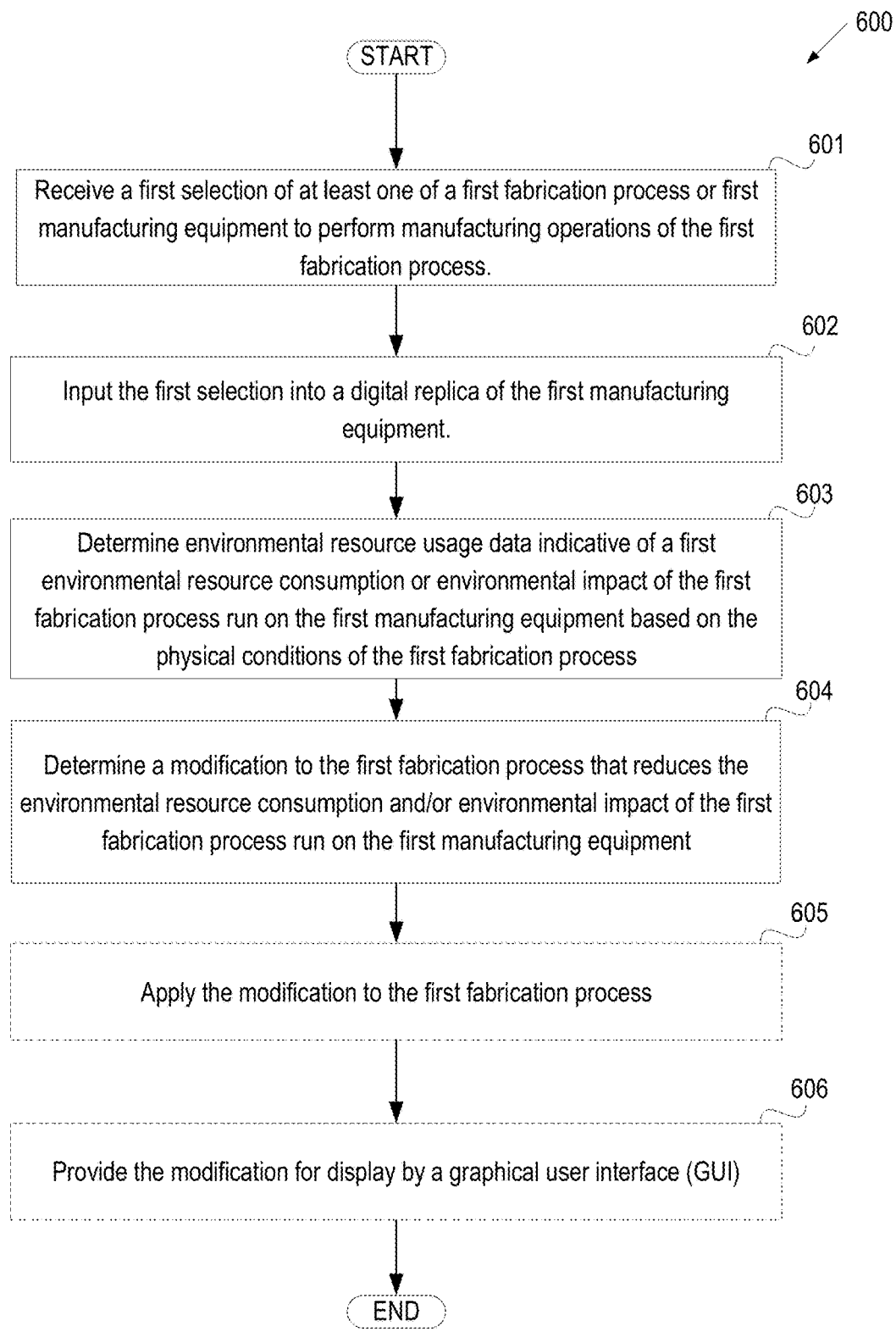
FIG. 6 is an exemplary illustration of method for identifying modifications to a manufacturing process, in accordance with some implementation of the present disclosure.
Figure 7A:
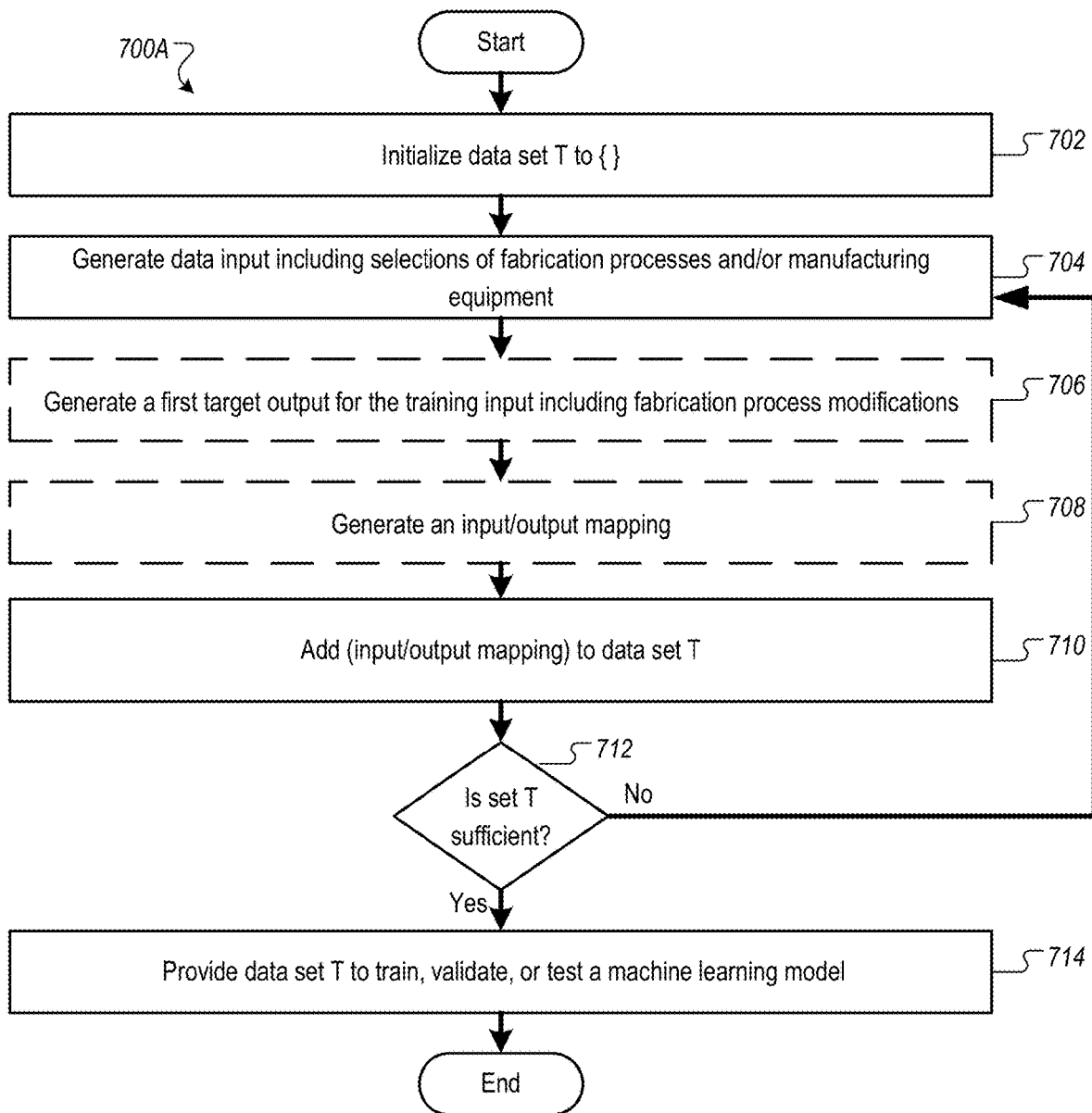
FIGS. 7A-C are flow diagrams of methods associated with identifying modifications to a manufacturing process, in accordance with some implementations of the present disclosure.

FIGS. 6-7A-C depict flow diagrams illustrating example methods 600-700A-C related to training and/or using machine learning models in association with environmental resource consumption and/or environmental impact of fabrication processes, in accordance with some implementation of the present disclosure. For simplicity of explanation, methods 600-700A-C are depicted and described as a series of acts. However, acts in accordance with this disclosure can occur in various orders and/or concurrently and with other acts not presented and described herein. Furthermore, not all illustrated acts may be performed to implement the methods 600-700A-C in accordance with the disclosed subject matter. In addition, those skilled in the art will understand and appreciate that methods 600-700A-C could alternatively be represented as a series of interrelated states via a state diagram or events.

FIG. 6 is an exemplary illustration of a method 600 for identifying modifications to a manufacturing process, in accordance with some implementation of the present disclosure. Method 600 is performed by processing logic that may comprise hardware (circuitry, dedicated logic, etc.), software (such as is run on a general purpose computer system or a dedicated machine) or any combination thereof. In one implementation, the method is performed using the server 120 and the trained machine learning model 190 of FIG. 1, while in some other implementations, one or more blocks of FIG. 6 may be performed by one or more other machines not depicted in the figures.

Method 600 may include receiving a selection of at least one of a first fabrication process or first manufacturing equipment to perform manufacturing operations of the first fabrication process and identify modifications and/or optimizations to improve eco-efficiency (reduce resource consumption and/or environmental impact). The fabrication process may be associated with a manufacturing system (e.g., manufacturing system 102 of FIG. 1).

At block 601, processing logic receives a first selection of at least one of a first fabrication process or first manufacturing equipment (e.g., tools 202 and subcomponents 204 of FIG. 2) to perform manufacturing operations of the first fabrication process.

At block 602, processing logic inputs the first selection into a digital replica (e.g., digital replica 400 of FIG. 4) of the first manufacturing equipment. In some embodiments, the digital replica may include a physics based model (e.g., physics based model 214 of FIG. 2)

At block 603, processing logic determines environmental resource usage data indicative of a first environmental resource consumption and/or environmental impact of the first fabrication process run on the first manufacturing equipment based on the physical conditions of the first fabrication process. In some embodiments, the environmental resource usage data includes at least one of an energy consumption, a gas consumption, or a water consumption associated with the first manufacturing equipment to perform the manufacturing operations of the first fabrication process.

In some embodiments, processing logic uses the environmental resource usage data as input to a machine learning model. The processing logic further includes obtaining one or more outputs of the machine learning model where the one or more outputs indicate the modification. In some embodiments, the one or more outputs of the machine learning model may further indicate a level of confidence that the modification, when performed, reduces the first environmental resource consumption and/or environmental impact of a fabrication process. Processing logic further determines that the level of confidence for the modification satisfies a threshold condition.

In some embodiments, the first environmental resource consumption and/or environmental impact comprises an environmental resource consumption and/or environmental impact associated with one of a replacement procedure or an upkeep procedure of a consumable part of the first manufacturing equipment.

In some embodiments, the environmental resource usage data include life-cycle data of a component associated with the manufacturing equipment. The modification may further include performing a corrective action associated with the component.

At block 604, processing logic determines a modification to the first fabrication process that reduces the environmental resource consumption and/or environmental impact of the first fabrication process (e.g., a per-unit resource consumption) run on the first manufacturing equipment. In some embodiments, the modification includes altering one or more of a fabrication process step and/or manufacturing equipment processing parameters. In some embodiments, a priority optimization of one or more of the energy consumption, the gas consumption, or the water consumption of the first manufacturing equipment to perform manufacturing operations of the first fabrication process.

At block 605, processing logic, optionally, applies the modification to the fabrication process. At block 606, processing logic, optionally, provides the modification for display by a graphical user interface (GUI). In some embodiments, multiple modifications are determined and provided for presentation on a graphical user interface (GUI) (e.g., for presentation to a user such as a system operator). In some embodiments, the modifications are presented to the user in rank order by confidence level. In some embodiments, the modifications are presented to the user with a visual indicator representing the confidence level associated with each prescriptive action. For example, one or more modifications with the highest confidence level may be depicted with first color (e.g., green or gold) and one or more modifications with a confidence level close to the threshold level may be depicted with a second color (e.g., yellow or silver). In some embodiments, the modifications may be placed in tiers or groups based on the associated confidence levels.

In some embodiments, processing logic may further determine that the first selection fails to satisfy a threshold eco-efficiency based on the environmental resource usage data. The processing logic may further perform an optimization of the first selection responsive to determining that the first selection fails to satisfy the threshold eco-efficiency. Performing the optimization of the first selection includes identifying one or more modification to the first selection that when applied result in an updated eco-efficiency that satisfies the threshold eco-efficiency.

In some embodiments the processing logic is further to receiving a second selection of manufacturing equipment to perform second manufacturing operations in a second fabrication process. The processing may receive, from one or more sensors associated with the second selection of manufacturing equipment, second sensor data associated with the second manufacturing operations. The processing logic may further update the digital replica to generate an updated digital replica, wherein the updated digital replica is associated with the first and second selection of manufacturing equipment. The processing logic may further obtain, from the digital replica, one or more outputs comprising aggregate environmental resource data indicative of an environmental resource consumption and/or environmental impact of the first selection and the second selection (e.g. per-unit consumption and/or impact).

Figure 7B:
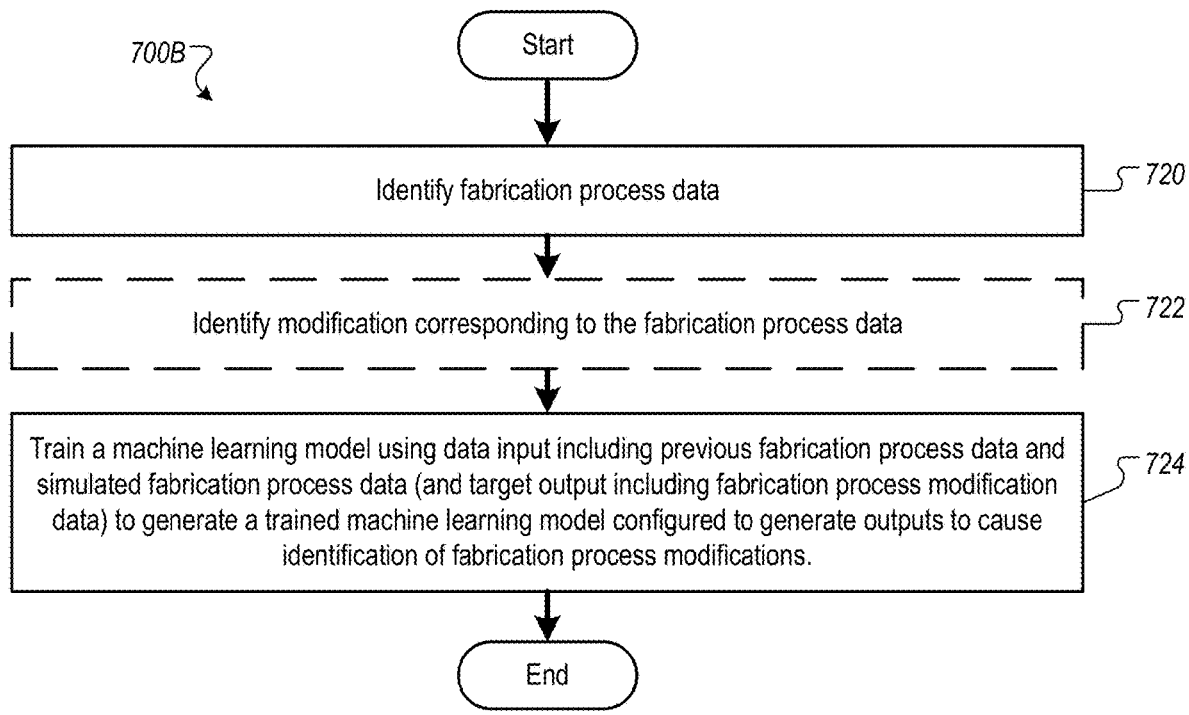
Figure 7C:
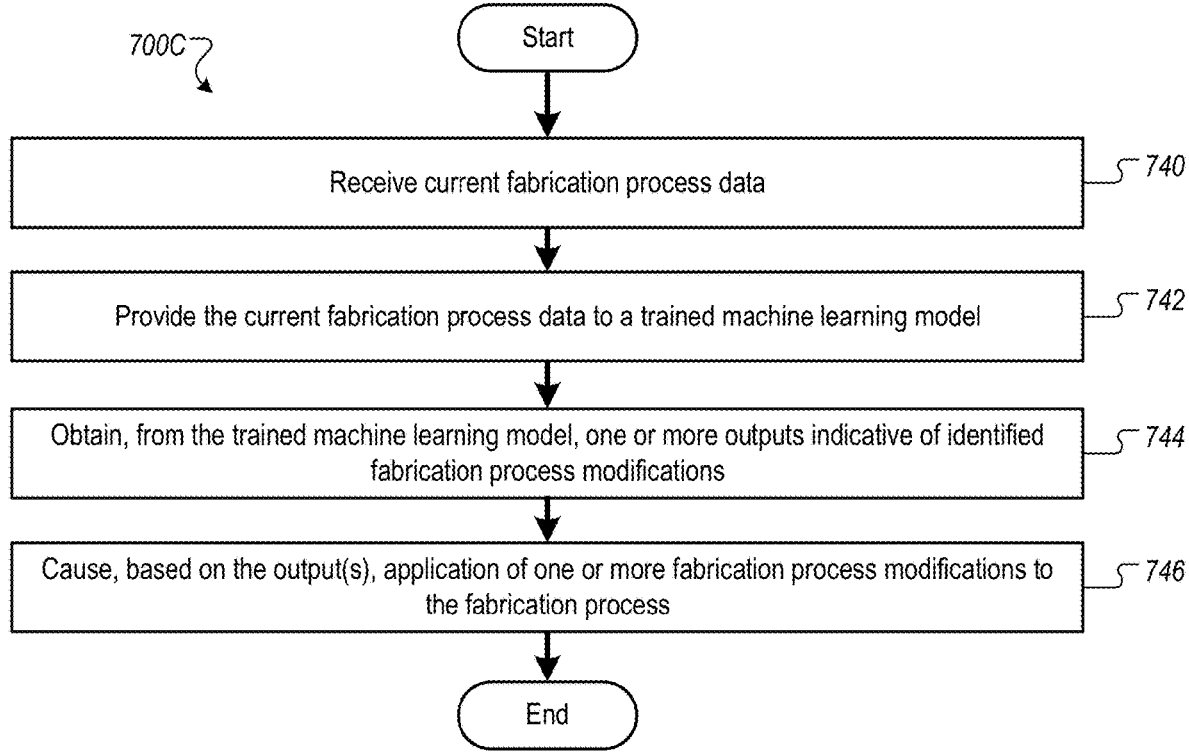

FIGS. 7A-C are flow diagrams of methods 700A-C associated with identifying modifications to a manufacturing process, in accordance with some implementations of the present disclosure. Methods 700A-C may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 700A may be performed, in part, by machine learning system 170 (e.g., server machine 172, data set generator 174, etc.). Machine learning system 170 may use method 700A to at least one of train, validate, or test a machine learning model, in accordance with embodiments of the disclosure. In some embodiments, one or more operations of method 700A may be performed by data set generator 174 of server machine 172. In some embodiments, methods 700B-C may be performed, in part, by machine learning system 170 (e.g., server machine 172, server machine 180, and server machine 192, etc.). Machine learning system 170 may use method 700B to train a machine learning model, in accordance with embodiments of the disclosure. Machine learning system 170 may use method 700C to use a trained machine learning model, in accordance with embodiments of the disclosure. In some embodiments, one or more operations of methods 700B-C may be performed by modification identification component 194 of machine learning system 170. It may be noted that components described with respect to one or more of FIGS. 1-6 may be used to illustrate aspects of FIGS. 7A-C. In some embodiments, a non-transitory storage medium stores instructions that when executed by a processing device (e.g., of machine learning system 170) cause the processing device to perform methods 700A-C.

For simplicity of explanation, methods 700A-C are depicted and described as a series of acts. However, acts in accordance with this disclosure can occur in various orders concurrently, in parallel with multiple instances per store, and/or with other acts not presented and described herein. Furthermore, not all illustrated acts may be performed to implement the methods 700A-C in accordance with the disclosed subject matter. In addition, those skilled in the art will understand and appreciate that the methods 700A-C could alternatively be represented as a series of interrelated states via a state diagram or events.

Referring to FIG. 7A, method 700A is associated with generating a data set for a machine learning model for processing selections of fabrication processes and/or manufacturing equipment to identify modifications to the inputs.

At block 702, the processing logic implementing method 700A initializes a training set T to an empty set.

At block 704, processing logic generates first data input (e.g., first training input, first validating input) that includes selections of fabrication processes and manufacturing equipment.

In some embodiments, at block 706, processing logic generates a first target output for one or more of the data inputs (e.g., first data input). The first target output may be for example, modification to fabrication process and/or manufacturing equipment. The processing logic may generate the target output based on the input selection of a fabrication process and/or manufacturing equipment.

At block 708, processing logic optionally generates mapping data that is indicative of an input/output mapping. The input/output mapping (or mapping data) may refer to the data input (e.g., one or more of the data inputs described herein), the target output for the data input (e.g., where the target output identifies output data), and an association between the data input(s) and the target output. Processing logic may perform gradient descent and back propagation to update weights for nodes at one or more layers of a machine learning model, for example.

At block 710, processing logic adds the data input generated at block 704 and/or the mapping data generated at block 708 to data set T.

At block 712, processing logic branches based on whether data set T is sufficient for at least one of training, validating, and/or testing machine learning model 190. If so, execution proceeds to block 714, otherwise, execution continues back at block 704. In some embodiments, the sufficiency of data set T may be determined based simply on the number of input/output mappings in the data set, while in some other implementations, the sufficiency of data set T may be determined based on one or more other criteria (e.g., a measure of diversity of the data examples, accuracy, etc.) in addition to, or instead of, the number of input/output mappings.

At block 714, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs) are input to the neural network, and output values (e.g., numerical values associated with target outputs) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 714, machine learning model (e.g., machine learning model 190) can be at least one of trained using training engine 182 of server machine 180, validated using validating engine 184 of server machine 180, or tested using testing engine 186 of server machine 180. The trained machine learning model may be implemented by modification identification component 194 (of machine learning system 170) to generate output data for further use by server 120 procedures (e.g., component integration tool 122, digital replica tool 124, optimization tool 126, recipe builder tool 128, and/or resource consumption tool 130.

Referring to FIG. 7B, method 700B is associated with training a machine learning model for determining modifications to fabrication processes and/or manufacturing equipment that improve eco-efficiency.

At block 720, processing logic receives a selection of a fabrication process or manufacturing equipment.

In some embodiments, at block 722, processing logic identifies labels corresponding to the modifications to fabrication processes. In some embodiments, the labels indicate a modification to a manufacturing equipment piece and/or fabrication process and associated reduction in environmental resource consumption and/or environmental impact.

At block 724, processing logic trains a machine learning model using data input including the fabrication process data (e.g., and target output including the labels) to generate a trained machine learning model configured to generate outputs (e.g., modifications) that can be applied to fabrication processes to reduce a environmental resource consumption and/or environmental impact.

In some embodiments, the machine learning model is trained based on data input (e.g., without target output) to generate a trained machine learning model using unsupervised learning (e.g., to cluster data). In some embodiments, the machine learning model is trained based on data input and target output to generate a trained machine learning model using supervised learning.

Referring to FIG. 7C, method 700C is associated with using a machine learning model for determining modifications to fabrication processes and/or manufacturing equipment to improve (e.g., optimize) eco-efficiency (e.g., reduce a environmental resource consumption and/or environmental impact).

At block 740, processing logic receives current fabrication process data. At block 742, processing logic provides the current data (e.g., fabrication process data) to a trained machine learning model. The trained machine learning model may be trained by method 700B.

At block 744, processing logic obtains, from the trained machine learning model, one or more outputs. In some embodiments, the outputs include modifications to a fabrication process and/or manufacturing equipment that, when implemented, will improve an eco-efficiency of the fabrication process and/or manufacturing equipment. At block 746, processing logic causes, based on the output(s), application of one of more fabrication process modifications to the fabrication process.

Figure 8:
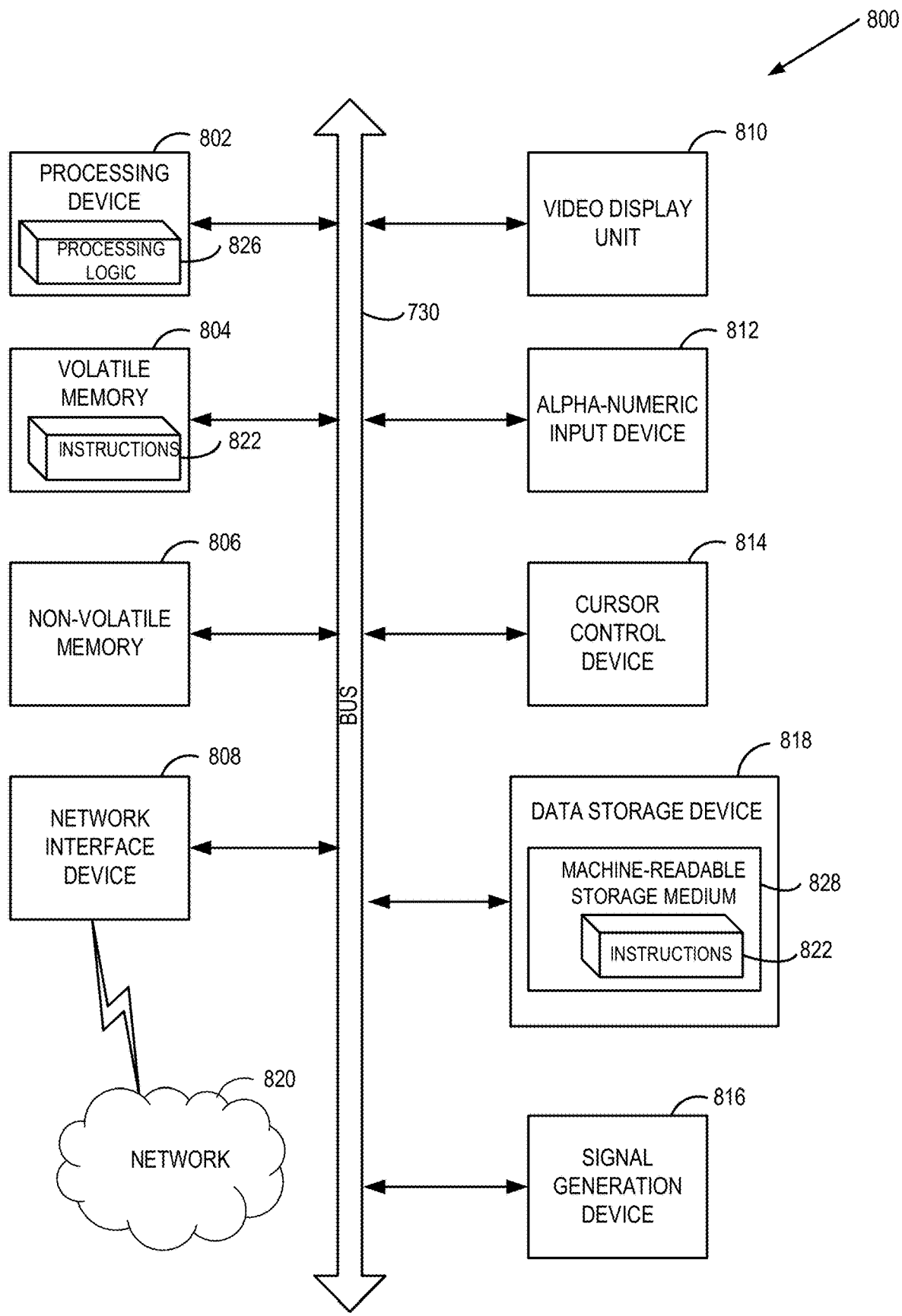
FIG. 8 depicts a block diagram of an example computing device, operating in accordance with one or more aspects of the present disclosure.

FIG. 8 depicts a block diagram of an example computing device, operating in accordance with one or more aspects of the present disclosure. In various illustrative examples, various components of the computing device 800 may represent various components of the client devices 150, server 120, data store 112, and machine learning system 170, illustrated in FIG. 1.

Example computing device 800 may be connected to other computer devices in a LAN, an intranet, an extranet, and/or the Internet (e.g., using a cloud environment, cloud technology, and/or edge computing). Computing device 800 may operate in the capacity of a server in a client-server network environment. Computing device 800 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 800 may include a processing device 802 (also referred to as a processor or CPU), a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 818), which may communicate with each other via a bus 830.

Processing device 802 represents one or more general-purpose processing devices such as a microprocessor, central processing unit, or the like. More particularly, processing device 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 802 may be configured to execute instructions implementing methods 600-700A-C illustrated in FIGS. 6-7.

Example computing device 800 may further comprise a network interface device 808, which may be communicatively coupled to a network 820. Example computing device 800 may further comprise a video display 810 (e.g., a liquid crystal display (LCD), a touch screen, or a cathode ray tube (CRT)), an alphanumeric input device 812 (e.g., a keyboard), a cursor control device 814 (e.g., a mouse), and an acoustic signal generation device 816 (e.g., a speaker).

Data storage device 818 may include a machine-readable storage medium (or, more specifically, a non-transitory machine-readable storage medium) 828 on which is stored one or more sets of executable instructions 822. In accordance with one or more aspects of the present disclosure, executable instructions 822 may comprise executable instructions associated with executing methods 600-700A-C illustrated in FIGS. 6-7.

Executable instructions 822 may also reside, completely or at least partially, within main memory 804 and/or within processing device 802 during execution thereof by example computing device 800, main memory 804 and processing device 802 also constituting computer-readable storage media. Executable instructions 822 may further be transmitted or received over a network via network interface device 808.

While the computer-readable storage medium 828 is shown in FIG. 8 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method, comprising:
    receiving, by a processing device, a first selection of a first fabrication process associated with a first manufacturing equipment of a first manufacturing environment;
    inputting, by the processing device, the first selection into a digital replica of the first manufacturing equipment, wherein the digital replica outputs estimated physical conditions of an environment within the first manufacturing equipment during performance of manufacturing operations of the first fabrication process;
    determining, by the processing device, environmental resource usage data indicative of a first environmental resource consumption of the first fabrication process run on the first manufacturing equipment based on the estimated physical conditions of the environment within the first manufacturing equipment during the first fabrication process;
    determining, by the processing device and based on the environmental resource usage data, an eco-optimized process parameter window comprising values for one or more process parameters for the fabrication process that will reduce the first environmental resource consumption of the first fabrication process when run using the first manufacturing equipment, wherein the values for the one or more process parameters of the eco-optimized process parameter window are associated with an improved reduction of the environmental resource consumption with respect to values for the one or more process parameters that are outside of the eco-optimized process parameter window; and applying, by the processing device, the values for the one or more process parameters of the eco-optimized process parameter window to the first fabrication process.

2. The method of claim 1, wherein further comprising:
providing the environmental resource usage data as input to a machine learning model; and
obtaining one or more outputs of the machine learning model, the one or more outputs indicating a modification to the fabrication process, the modification corresponding to the eco-optimized process parameter window.

3. The method of claim 2, wherein the one or more outputs further indicate a level of confidence that the modification, when applied to the fabrication process, reduces the first environmental resource consumption of the fabrication process, the method further comprising:
determining that the level of confidence for the modification satisfies a threshold condition.

4. The method of claim 1 further comprising:
determining that the first selection fails to satisfy a threshold eco-efficiency based on the environmental resource usage data; and
responsive to determining that the first selection fails to satisfy the threshold eco-efficiency, performing an optimization of the first selection, wherein performing the optimization of the first selection comprises identifying one or more modifications to the first selection that when applied result in an updated eco-efficiency that satisfies the threshold eco-efficiency.

5. The method of claim 1, wherein the environmental resource usage data comprises at least one of an energy consumption, a gas consumption, or a water consumption associated with the first manufacturing equipment to perform the manufacturing operations of the first fabrication process.

6. The method of claim 5, wherein the eco-optimized process parameter window is associated with a priority optimization of one or more of the energy consumption, the gas consumption, or the water consumption of the first manufacturing equipment to perform manufacturing operations of the first fabrication process.

7. The method of claim 1, wherein the digital replica comprises a physics based model of the first manufacturing equipment to perform the manufacturing operations of the first fabrication process.

8. The method of claim 1, further comprising:
receiving a second selection of manufacturing equipment to perform second manufacturing operations in a second fabrication process;
receiving, from one or more sensors associated with the second selection of manufacturing equipment, second sensor data associated with the second manufacturing operations;
updating the digital replica to generate an updated digital replica, wherein the updated digital replica is associated with the first and second selection of manufacturing equipment; and
obtaining, from the digital replica, one or more outputs comprising aggregate environmental resource data indicative of a second environmental resource consumption of the first selection and the second selection.

9. The method of claim 1, wherein the first environmental resource consumption comprises an environmental resource consumption associated with one of a replacement procedure or an upkeep procedure of a consumable part of the first manufacturing equipment.

10. The method of claim 1, wherein the environmental resource usage data comprises life-cycle data of a component associated with the first manufacturing equipment, and wherein the eco-optimized process parameter window corresponds to corrective action associated with the component.

11. A method for training a machine learning model to identify modifications to a selection of a fabrication process associated with a manufacturing equipment to perform manufacturing operations of the fabrication process, wherein the modifications are associated with reducing an environmental resource consumption of the fabrication process, the method comprising:
generating, by a computing device, training data for the machine learning model, wherein generating the training data comprises:
identifying a first training input comprising fabrication process data, the fabrication process data indicating a first selection of a first fabrication process and physical conditions of an environment within first manufacturing equipment during performance of the first fabrication process; and
identifying a first target output for the first training input, wherein the first target output comprises an eco-optimized process parameter window comprising values for one or more process parameters for the first fabrication process that reduce a first environmental resource consumption of the first fabrication process, wherein the values for the one or more process parameters of the eco-optimized process parameter window are associated with an improved reduction of the environmental resource consumption with respect to values for the one or more process parameters that are outside of the eco-optimized process parameter window; and
providing, by the computing device, the training data to train the machine learning model on (i) a set of training inputs comprising the first training input; and (ii) a set of target outputs comprising the first target output, wherein the trained machine learning model is to receive a new selection of a new fabrication process as input and to produce a new output based on the new input, the new output indicating a modification to the new fabrication process that, when applied, reduces a new environmental resource consumption of the new fabrication process, the modification corresponding to a new eco-optimized process parameter window.

12. The method of claim 11, wherein generating the training data further comprises:
inputting the first selection into a digital replica of the first manufacturing equipment associated with the first fabrication process, wherein the digital replica outputs the physical conditions of the environment within the first manufacturing equipment during performance of the first fabrication process.

13. The method of claim 11, wherein the new environmental resource consumption comprises one of an energy consumption, a gas consumption, or a water consumption associated with a new manufacturing equipment performing manufacturing operations of the new fabrication process.

14. The method of claim 11, wherein each training input in the set of training inputs is mapped to a target output in the set of target outputs.

* * * * *